US006891363B2

(12) United States Patent
Desplats et al.

(10) Patent No.: US 6,891,363 B2
(45) Date of Patent: May 10, 2005

(54) APPARATUS AND METHOD FOR DETECTING PHOTON EMISSIONS FROM TRANSISTORS

(75) Inventors: Romain Desplats, Toulouse (FR); Patricia Le Coupanec, Fremont, CA (US); William K. Lo, San Jose, CA (US); Philippe Perdu, Toulouse (FR); Steven Kasapi, San Francisco, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/234,231

(22) Filed: Sep. 3, 2002

(65) Prior Publication Data

US 2004/0041575 A1 Mar. 4, 2004

(Under 37 CFR 1.47)

(51) Int. Cl.[7] ............................................. G01R 31/02
(52) U.S. Cl. ..................... 324/158.1; 324/764
(58) Field of Search ................... 324/158.1, 537, 324/764, 765, 768, 769; 382/278–281

(56) References Cited

U.S. PATENT DOCUMENTS

| | | | |
|---|---|---|---|
| 4,091,277 A | 5/1978 | Doblhofer | 250/214 R |
| 4,115,694 A | 9/1978 | Lange et al. | 250/363 S |
| 4,242,635 A | 12/1980 | Burns | 324/158 R |
| 4,415,807 A | 11/1983 | Friauf et al. | 250/363 S |
| 4,431,914 A | 2/1984 | Mourou et al. | 250/211 J |
| 4,555,731 A | 11/1985 | Zinchuk | 358/209 |
| 4,591,984 A | 5/1986 | Mori | 364/414 |
| 4,680,635 A | 7/1987 | Khurana | 358/211 |
| 4,686,371 A | 8/1987 | Birch et al. | 250/461.1 |
| 4,704,522 A | 11/1987 | Hirai et al. | 250/213 VT |
| 4,706,018 A | 11/1987 | Beha et al. | 324/158 R |
| 4,755,874 A | 7/1988 | Esrig et al. | 358/106 |
| 4,766,372 A | 8/1988 | Rao | 324/158 R |
| 4,811,090 A | 3/1989 | Khurana | 358/93 |
| 4,845,425 A | 7/1989 | Beha et al. | 324/158 R |
| 4,858,128 A * | 8/1989 | Nowak | 382/131 |
| 4,922,092 A | 5/1990 | Rushbrooke et al. | 250/213 V |
| RE33,241 E | 6/1990 | Tsuchiya | 356/318 |
| 4,992,662 A | 2/1991 | Danilatos | 250/310 |
| 5,006,717 A | 4/1991 | Tsutsu et al. | 250/484.1 |
| 5,043,584 A | 8/1991 | Koishi | 250/458.1 |
| 5,164,664 A | 11/1992 | Soelkner | 324/158 R |
| 5,168,164 A | 12/1992 | Urakami et al. | 250/458.1 |
| 5,175,495 A | 12/1992 | Brahme et al. | 324/158 R |

(Continued)

FOREIGN PATENT DOCUMENTS

WO PCT/US03/27267 4/2004
WO PCT/US03/38616 4/2004

OTHER PUBLICATIONS

Firmani, C. et al., "High–Resolution Imaging With a Two–Dimensional Resistive Anode Photon Counter", Rev. Sci. Instrum. 53 (5); pp. 570–574, (May 1982).

(Continued)

Primary Examiner—David Zarneke
Assistant Examiner—Russell M. Kobert
(74) Attorney, Agent, or Firm—Dorsey & Whitney LLP

(57) ABSTRACT

A system, apparatus, and method for analyzing photon emission data to discriminate between photons emitted by transistors and photons emitted by background sources. The analysis involves spatial and/or temporal correlation of photon emissions. After correlation, the analysis may further involve obtaining a likelihood that the correlated photons were emitted by a transistor. After correlation, the analysis may also further involve assigning a weight to individual photon emissions as a function of the correlation. The weight, in some instances, reflecting a likelihood that the photons were emitted by a transistor. The analysis may further involve automatically identifying transistors in a photon emission image.

23 Claims, 22 Drawing Sheets

U.S. PATENT DOCUMENTS

| | | | |
|---|---|---|---|
| 5,301,006 A | 4/1994 | Bruce | 356/311 |
| 5,304,791 A | 4/1994 | Migliaccio | 250/214 VT |
| 5,391,885 A | 2/1995 | Imataki et al. | 250/492.2 |
| 5,424,558 A | 6/1995 | Borden et al. | 250/573 |
| 5,451,863 A | 9/1995 | Freeman | 324/96 |
| 5,475,316 A | 12/1995 | Hurley et al. | 324/750 |
| 5,504,431 A | 4/1996 | Maeda et al. | 324/501 |
| 5,523,694 A | 6/1996 | Cole, Jr. | 324/751 |
| 5,541,547 A | 7/1996 | Lam | 327/355 |
| 5,561,293 A | 10/1996 | Peng et al. | 250/307 |
| 5,598,100 A | 1/1997 | Maeda et al. | 324/501 |
| 5,650,643 A | 7/1997 | Konuma | 257/225 |
| 5,656,807 A | 8/1997 | Packard | 250/214 VT |
| 5,661,520 A | 8/1997 | Bruce | 348/92 |
| 5,724,131 A | 3/1998 | Chim et al. | 356/237 |
| 5,754,291 A | 5/1998 | Kain | 356/338 |
| 5,760,892 A | 6/1998 | Koyama | 356/237 |
| 5,869,842 A | 2/1999 | Kang et al. | 250/551 |
| 5,940,545 A | 8/1999 | Kash et al. | 382/312 |
| 5,970,167 A | 10/1999 | Colvin | 382/149 |
| 6,028,434 A | 2/2000 | Bushman | 324/750 |
| 6,049,079 A | 4/2000 | Noordam et al. | 250/338.1 |
| 6,076,010 A | 6/2000 | Boas et al. | 600/477 |
| 6,078,681 A | 6/2000 | Silver | 382/133 |
| 6,078,877 A | 6/2000 | Fujii et al. | 702/188 |
| 6,327,394 B1 | 12/2001 | Kash et al. | 382/280 |
| 6,469,529 B1 | 10/2002 | Bruce et al. | 324/752 |
| 6,515,304 B1 | 2/2003 | Kash et al. | 257/79 |
| 6,521,479 B1 | 2/2003 | Harrison et al. | 438/106 |
| 6,526,415 B2 | 2/2003 | Smith et al. | 707/104.1 |
| 6,657,222 B1 | 12/2003 | Foden et al. | 257/13 |

OTHER PUBLICATIONS

Charbonneau, S. et al., "Two–Dimensional Time–Resolved Imaging with 100–ps Resolution Using a Resistive Anode Photomultiplier Tube", Rev. Sci. Instrum., 63 (11), pp. 5315–5319, (Nov. 1992).

Shah, Jagdeep et al., "Subpicosecond Luminescence Spectroscopy Using Sum Frequency Generation", Appl. Phys. Lett., pp. 1307–1309, (May 1987).

McMullan, W. G. et al., "Simultaneous Subnanosecond Timing Information and 2D Spatial Information From Imaging Photomultiplier Tubes", Rev. Sci. Instrum., American Institute of Physics, 58 (9), pp. 1626–1628, (Sep. 1987).

Cova, S. et al., "Constant–Fraction Circuits for Picosecond Photon Timing With Microchannel Plate Photomultipliers", Rev. Sci. Instrum. 64(1), pp. 118–124, Jan. 1993.

Berndt, R. et al., "Atomic Resolution in Photon Emission Induced by a Scanning Tunneling Microscope", The American Physical Society, Physical Review Letters, vol. 74, No. 1, pp. 102–103, (1994), month unavailable.

Hungerford, G. et al., "Single–Photon Timing Detectors for Fluorescence Lifetime Spectroscopy", Macs. Sci. Technol., 7, pp. 121–135, (1996), month unavailable.

Tsung, J. C. et al., "Picosecond Imaging Circuit Analysis", IBM Journal of Research and Development, vol. 44, No. 4, (Jul. 2000).

Hawkins, C. et al., "The Use of Light Emission in Failure Analysis of CMOS Ics", ISTFA, pp. 55–67, (1990), month unavailable.

Weste, N. et al., "Principles of CMOS VLSI Design: A Systems Perspective", Second Edition, (1993), month unavailable.

"Evaluation of Hot Carrier Induced Degradation of MOSFET Device", Agilent Technologies, pp. 1–4, (2000), month unavailable.

"Photon Counting: A Brief History", Photek, http://fp.photek.plus.com, (Date printed Nov. 8, 2002).

Dajee G. et al., "Practical, Non–Invasive Optical Probing for Flip–Chip Devices," IEEE, pp. 433–442, (2001), month unavailable.

"The National Technology Roadmap for Semiconductors: Technology Needs", SIA Semiconductor Industry Association, (1997), month unavailable.

"Emission Microscopy/Liquid Crystal", Accurel Systems International Inc., http://www.accurel.com/html/Services/EMLC, (2002), month unavailable.

"PEM–1000 Photon Emission Microscope", TNP Instruments, Inc., http://www.tripinstruments.com/pen 1000.htm, (1999), month unavailable.

"Spectroscopic Photon Emission Microscopy Studies of Semiconductor Devices", National University of Singapore, Engineering Research, http://eng.nus.edu.sg/Eresnews, vol. 12, No. 1, (Feb. 1997).

Vasile et al., "Photon Detection With High Gain Avalanche Photodiode Arrays", Radiation Monitoring Devices, Inc., IEEE Trans. Nucl. Sci., http://www.rmdinc.com, (1998), month unavailable.

Thompson, T., "Charged–Coupled Device", Computer World, Inc., http://www.computerworld.com, (Aug. 6, 2001).

"Space Research Yields High–Tech Reward", University of Rochester, http://www.rochester.edu, (Aug. 13, 2001).

Ouellette, J., "Failure Analysis in a Nanometer World", The Industrial Physicist, pp. 11–14, (Jun. 1998).

Tsang, J., "The Characterization of Switching Activity in Working IC's by Picosecond Hot Carrier Emission from CMOS Gates", University of Illinois at Urbana–Champaign College of Engineering, http://ece.uiuc.edu, (Oct. 8, 1998).

Derbyshire, K., "Prospects Bright for Optoelectronics Volume, Cost Drive Manufacturing for Optical Applications", Semi Conductor Magazine, vol. 3, No. 3, http://www.semi.org., (Mar. 2002).

"Hot–Electron Effect in Superconductors and Its Applications for Radiation Sensors", Cascade Microtech, Inc., LLE Review, vol. 87, 134–136, (1994), month unavailable.

Kituchi, M., "Visible Light Emission and Microplasma Phenomena in Silicon p–n Junction", Journal of the Physical Society of Japan, vol. 15, No. 12, pp. 1822–1831, (Oct. 1960).

Das, N. C. et al., Luminescent Spectra of an n–Channel Metal–Oxide–Semiconductor Field–Effect Transistor at Breakdown, Appl. Phys. Lett. 57 (12), pp. 1152–1153, (Mar. 19, 1990).

Kuo, M. M. et al., "Simulation of MOSFET Lifetime Under AC Hot–Electron Stress", IEEE Transactions on Electron Devices, vol. 35, No. 7, (Jul. 1988).

Bellens, R. et al., "The Influence of the Measurement Setup on Enhanced AC Hot Carrier Degradation of MOSFET's", IEEE Transactions of Electron Devices, vol. 37, No. 1, pp. 310–313, (Jan. 1990).

Hawkins, C. F. et al., "Quiescent Power Supply Current Measurement for CMOS IC Defect Detection", IEEE Transactions on Industrial Electronics, vol. 36, No. 2, pp. 211–218, (May 1989).

Hu, C. et al., "Hot–Electron–Induced MOSFET Degradation—Model, Monitor, and Improvement", IEEE Transactions on Electron Devices, vol. ED–32, No. 2, pp. 375–385, (Feb. 1985).

Toriumi, A. et al., "A Study of Photon Emission form n–Channel MOSFET's", IEEE Transactions on Electron Devices, vol. ED–34, No. 7, pp. 1501–1508, (Jul. 1987).

Tam, S. et al., "Hot–Electron–Induced Photon and Photocarrier Generation in Silicon MOSFET's", IEEE Transactions on Electron Devices, vol. ED–31, No. 9, pp. 1264–1273, (Sep. 1984).

van der Pol, J. A. et al., "Relation Between the Hot Carrier Lifetime of Transistors and CMOS SRAM Products", 1990 IEEE Annual International Reliability Physics, New Orleans, pp. 178–185, (1990), month unavailable.

Stehle, P., "Particle Transport, Electric Currents, and Pressure Balance in a Magnetically Immobilized Plasma", The Physical Review, Second Series, vol. 100, No. 2, p. 443, (Oct. 15, 1955).

Newman, R., "Visible Light From a Silicon p–n Junction", The Physical Review, vol. 100, No. 2, pp. 700–703, (Oct. 15, 1955).

Kressel, H., "A Review of the Effect of Imperfections on the Electrical Breakdown of p–n Junctions", RCA Review, vol. 28, No. 2, pp 175–207, (Jun. 1967).

Chynoweth,, A. G. et al., Effect of Dislocations on Breakdown in Silicon p–n Junctions, Journal of Applied Physics, vol. 29, No. 7, pp. 1103–1110, (Jul. 1958).

Goetzberger, A. et al., "Avalanche Effects in Silicon p–n Junctions. II. Structurally Perfect Junctions", Journal of Applied Physics, vol. 34, No. 6, pp. 1591–1600, (Jun. 1963).

Tam, S. et al., "Spatially Resolved Observation of Visible-–Light Emission From Si MOSFET's", IEEE Electron Device Letters, vol. EDL–4, No. 10, pp. 386–388, (Oct. 1983).

Lampert, M. A., "Incidence of an Electromagnetic Wave on a 'Cerenkov Electron Gas'", The Physical Review, Second Series, vol. 102, No. 2, pp. 299–376, (Apr. 15, 1956).

Weber, W. et al., "Degradation of n–MOS–Transistors After Pulsed Stress", IEEE Electron Device Letters, vol. EDL–5, No. 12, pp. 518–520, (Dec. 1984).

Chiang, C. et al., "Imaging and Detection of Current Conduction in Dielectric Films by Emission Microscopy", IEEE, pp. 672–675, (1986), month unavailable.

Das, N. C. et al., "Visible Light Emission from Silicon MOSFETS", Solid–State Electronics, vol. 28, No. 10, pp. 967–977, (1985), month unavailable.

Childs, P. A. et al., "Evidence of Optical Generation of Minority Carriers From Saturated MOS Transistors", Solid–State Electronics, vol. 26, No. 7, pp. 685–688, (1983), month unavailable.

Khurana, N. et al., "Analysis of Product Hot Electron Problems by Gated Emission Microscopy", IEEE/IRPS, pp. 72–76, (1987), month unavailable.

Khurana, N. et al., "Dynamic Imaging of Current Conduction in Dielectric Films by Emission Microscopy", IEEE/IRPS, pp. 72–76. (1987), month unavailable.

Hawkins, C. et al., "Reliability of Electrical Properties of Gate Oxide Shorts in CMOS ICs", IEEE, pp. 443–451, (1986), month unavailable.

Wills, K. et al., "Photoemission Testing for ESD Failures Advantages and Limitations", EOS/ESD Symposium Proceedings, pp. 53–61, (1988), month unavailable.

Toriumi, A. et al., "A Study of Photon Emission from n–Channel MOSFET's", IEEE Transactions on Electron Devices, vol. ED–34, No. 7, (Jul. 1987).

Tsuchiya, T. et al., "Emission Mechanism and Bias–Dependent Emission Efficiency of Photons Induced by Drain Avalanche in Si MOSFET's", IEEE Transactions on Electron Devices, vol. ED–32, No. 2, pp. 405–412, (Feb. 1985).

Boit, C. et al., "Discrimination of Parasitic Bipolar Operating Modes in ICs With Emission Microscopy", IEEE/IRPS, pp. 81–85, (1990), month unavailable.

Fritzemeier, R. R. et al., "Increased CMOS Stuck–All Fault Coverage With reduced IDDQ Test Sets", IEEE, pp. 427–435, (1990), month unavailable.

Subrahmaniam, R. et al., "MOSFET Degradation Due to Hot–Carrier Effect at High Frequencies", IEEE Electronic Device Letters, vol. 11, No. 1, pp. 21–23, (Jan. 1990).

Wills, K. et al., "Photoemission Testing For EOS/ESD Failures in VLSI Devices: Advantages and Limitations", Proceedings of the International Symposium for Testing and Failure Analysis, pp. 183–192, (Nov. 1989).

Hawkins, C. et al., "Electrical Characteristics and Testing Considerations for Gate Oxide Shorts in CMOS ICs", IEEE International Test Conference, Paper 15.5, pp. 544–555, (1985), month unavailable.

Shade, G. F., "Physical Mechanisms for Light Emission Microscopy", Proceedings International Symposium for Testing and Failure Analysis, pp. 121–128, (1990), month unavailable.

Tsutsu N. et al., New Detection Method of Hot–Carrier Degradation Using Photon Spectrum Analysis of Weak Luminescence on CMOS VLSI, Proc. IEEE 1990 Int. Conference on Microelectronic Test Structures, vol. 3, pp. 143–148, (Mar. 1990).

Singer, P. H., "Live TV Pictures of Transistor Failure", Semiconductor International, p. 30, (Mar. 1986).

Wolters, D. R. et al., "Dielectric Breakdown in MOS Devices", Philips Journal of Research, vol. 40, No. 3, pp. 115–192, (1985), month unavailable.

Lim, S. et al., "Detection of Junction Spiking and Its Induced Latchup by Emission Microscopy", Proceedings of the International Reliability Physics Symposium, pp. 119–125, (1988), month unavailable.

Soden, J. M. et al., "ESD Evaluation of Radiation–Hardened, High Reliability CMOS and MNOS ICs", Electrical Overstress/Electrostatic Discharge Symposium Proceedings 1983, pp. 134–146, (Sep. 1983).

Sze, S. M., "IMPATT and Related Transmit–Time Diodes", Physics of Semiconductor Devices, Second Edition, p. 596, (1981), month unavailable.

"Picosecond Imaging Circuit Analysis", Press Release, International Business Machines Corporation, http://ibm-.com, (Printed on Nov. 6, 2002).

"Atomic/Molecular/Optical Physics", Article, Celebrate a Century of Physics 1899–1999, Atlanta Georgia, Physics News in 1998, (Mar. 20–26, 1999).

"Seeing the Light" "Patents on the Web", International Business Machines Corporation, http//ibm.com, (Printed Nov. 6, 2002).

* cited by examiner

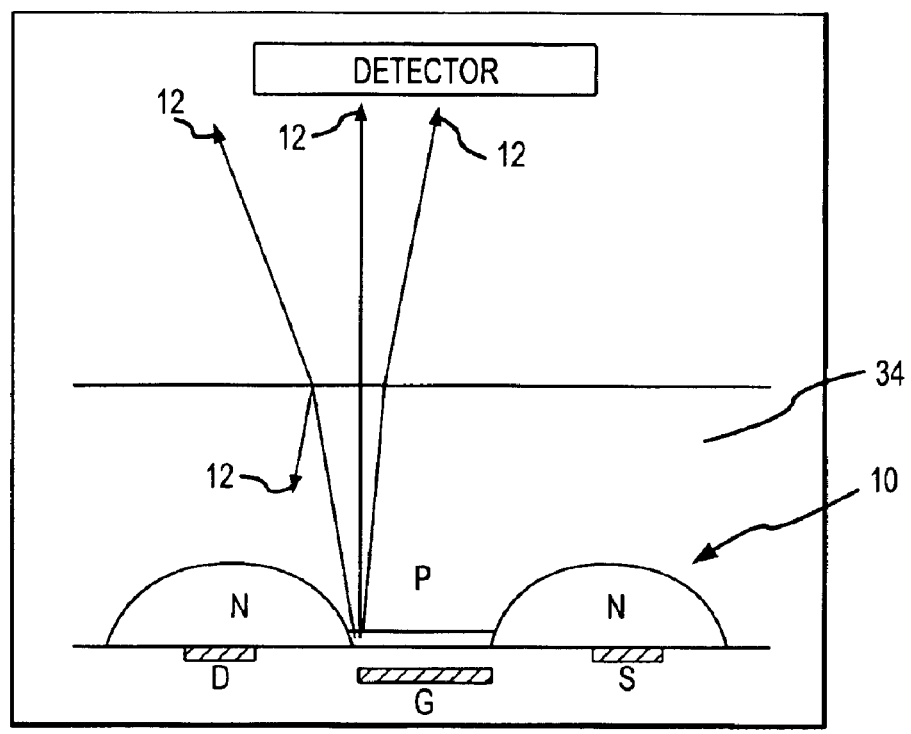
FIG. A (BACKGROUND)

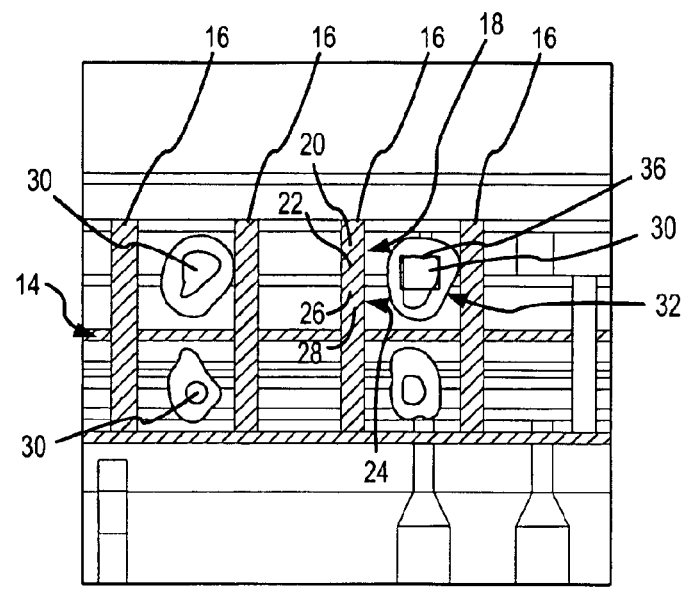
FIG. B (BACKGROUND)
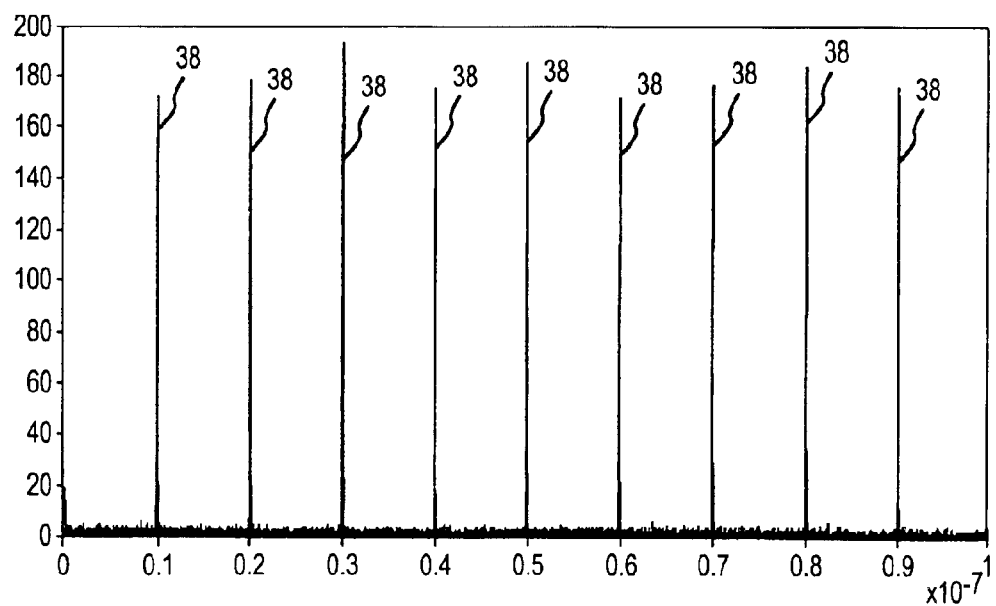
FIG. C (BACKGROUND)

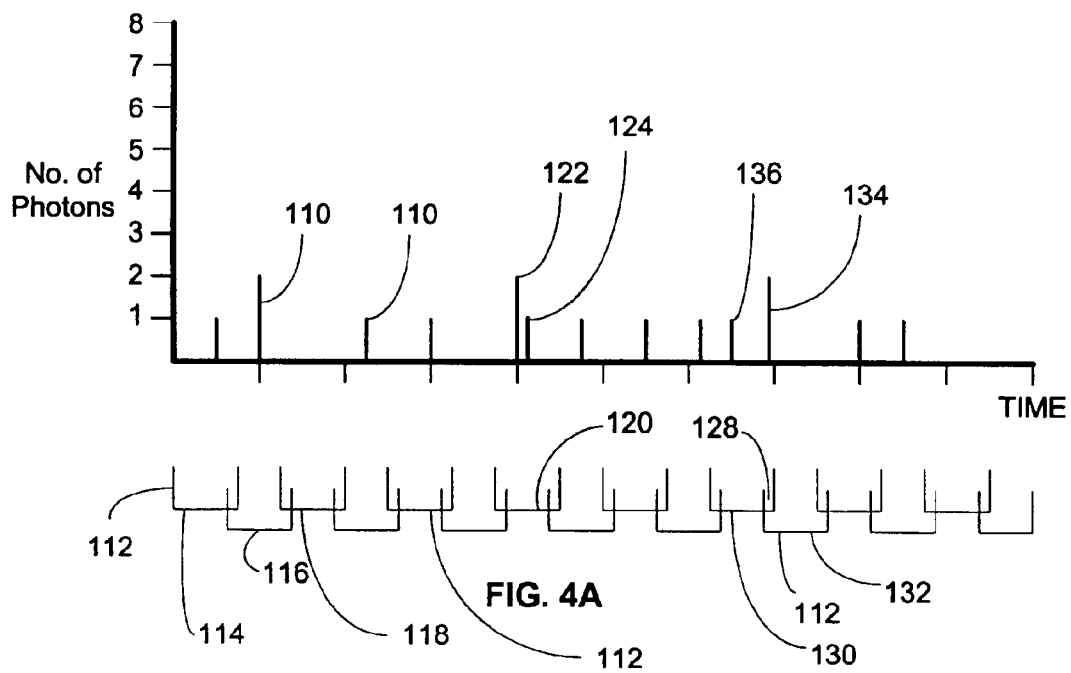
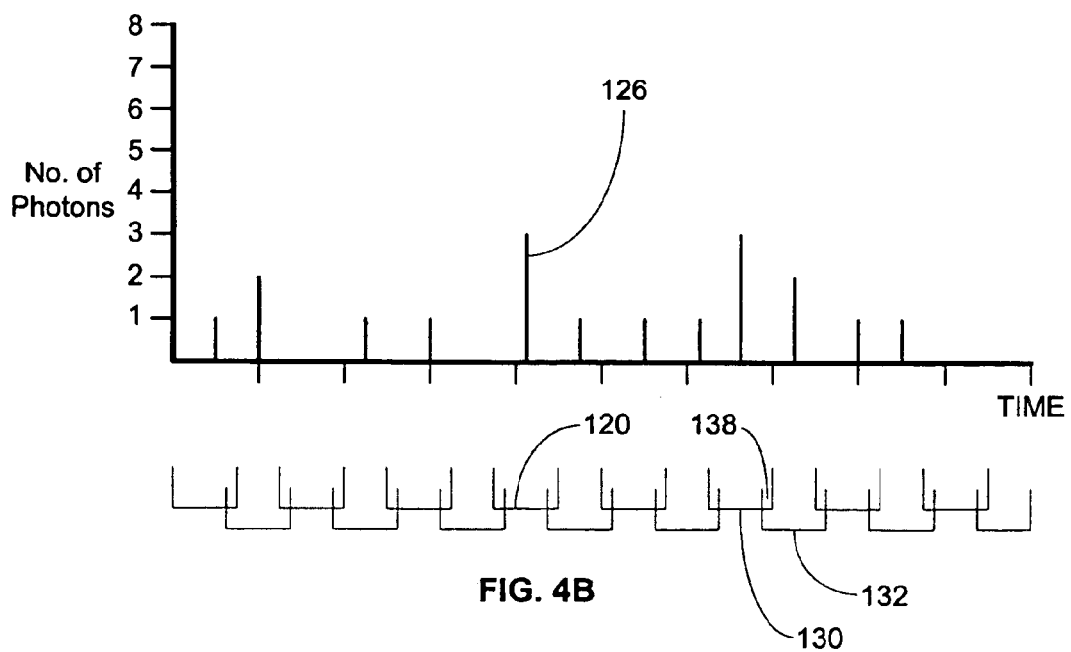

APPARATUS AND METHOD FOR DETECTING PHOTON EMISSIONS FROM TRANSISTORS

FIELD OF THE INVENTION

The present invention involves an apparatus and method for detecting photon emissions from one or more transistors, and more particularly involves an apparatus and method for rapidly discriminating between background photon emissions and transistor photon emissions, automatically identifying one or more transistors from photon emission data, and generating timing information for the identified transistors.

BACKGROUND OF THE INVENTION

The design and development of an integrated circuit (IC) oftentimes involves extensive testing to ensure that the IC functions correctly. It is common for an IC to include many millions of individual CMOS transistors in various logical arrangements to perform the functions of the IC. The physical size of CMOS transistors is continually shrinking, and gate length as small as 0.13 microns is becoming common. Testing such small discrete elements of an IC is difficult or impossible to perform by physically probing the IC. Moreover, physically probing the IC can easily damage it.

Various technologies exist to test discrete transistors in an IC without physically probing them. One such technology detects faint emissions of light from functioning CMOS transistors. This technology is described in U.S. Pat. No. 5,940,545 (hereafter "the '545 patent") entitled "Noninvasive Optical Method for Measuring Internal Switching and Other Dynamic Properties of CMOS Circuits," which is hereby incorporated by reference in its entirety as though fully set forth herein. In some instances, when current flows through a transistor while it is switching, it may emit a photon. FIG. A (Background) is a diagram of a CMOS transistor 10 emitting photons 12. The '545 patent describes a technology that can detect and record the location and time of photon emissions from a switching CMOS transistor. A commercially available probe system that employs aspects of the technology described in the '545 patent is the NPTest or Schlumberger IDS PICA (Picosecond Imaging Circuit Analysis) probe system.

FIG. B (Background) is a diagram illustrating an example of a photon emission image from the IDS PICA probe system. The image of photon emission data is shown overlaid on a laser scanning microscope (LSM) image of the IC for which the photon emission data was collected. The portion of the IC shown in the LSM image is a four-line inverter block 14 comprising 20 CMOS transistor pairs. A CMOS inverter comprises a complementary pair of an NMOS (or n-channel) transistor and a PMOS (or p-channel) transistor. The dark generally vertical lines correspond with CMOS transistor pairs 16 in the inverter chain. Particularly, one portion of the top first line of the inverter chain comprises a first CMOS transistor pair 18 with a first p-channel region 20 arranged above a first n-channel region 22, and one portion of the second line, below the first line, comprises a second CMOS transistor pair 24 with a second n-channel region 26 arranged above a second p-channel region 28. The n-channel regions of the inverters tend to emit more photons than the p-channel regions. The bright areas 30 surrounded by dark rings are clusters of photon emissions on the image of the photon emission data. A high concentration of photon emissions 32 appears adjacent the n-channel regions (22, 26) of the first and second CMOS transistor pairs (16, 24). Thus, a person viewing the photon emission data overlaid on the LSM image might assume that the high concentration of photon emissions adjacent the transistors were emitted by the two transistors.

With current probe systems, several factors make the identification of photons emitted from a transistor a timely endeavor. Some probe systems employing the '545 patent technology include a time and position resolved photon counting multiplier tube (PMT) to detect single photon emissions from a transistor. With currently available PMT detectors, the probability of detecting a near infrared photon for each switching event is in the range of $10^{-7}$ to $10^{-11}$ photons per switching event per $\mu$m of gate width. The quantum efficiency of the available PMT detectors is poor in the near infrared spectrum, but is higher in the visible spectrum. Processing an IC to collect photon emissions involves removing some, but not all, of the silicon 34 (see FIG. A) over the transistor. The remaining silicon allows transmission of some near infrared spectrum, but blocks the visible spectrum. Thus, the transistors in an IC must perform millions of switches before it is likely that even one photon from each of the transistors is detected.

To exacerbate the very low probability of detecting a photon from a transistor, probe systems also detect background noise photons coming from the probe system itself and from other sources. Thus, transistor photon emissions are mixed with background photon emissions. In many instances, probe systems require the detection of 10 million photons or more (both from transistors and background) before a user can discern whether photons may be attributed to transistors or background. The detection of 10 million or more photons may take hours or days, which in some instances may be prohibitively long.

The photon emission data collected by a probe system may be used to determine the timing characteristics of transistors. In a normally operating CMOS transistor, photon emission is synchronous with current flowing in the channel in the presence of high electric fields. Stated another way, photons are only emitted from a CMOS transistor when it is switching. Thus, the emission of photons from a transistor can be used to extract timing information about the transistor.

To extract timing information for a transistor, the probe system may be used to generate a histogram of the time when photon emissions were detected. One drawback of conventional probe systems is that they lack the ability to process the photon emission data to automatically identify photons that were emitted by transistors. Thus, to obtain a histogram for any particular transistor, conventional probe systems provide a graphical user interface (GUI) for a user to manually define a channel 36 around a portion of the displayed photon emission data that he or she believes may have been emitted by a transistor. The channel 36 is shown as a rectangle in the photon emission image illustrated in FIG. B. To properly locate the channel, typically, the user will compare the photon emission data with a schematic diagram for the IC being tested and define a channel around the photon emissions he or she suspects were emitted by the transistor. The probe system may then generate a histogram for the photons within the channel.

FIG. C (Background) illustrates a histogram of the timing pattern for the photons within the channel illustrated in FIG. B. The histogram shows ten photon emission peaks 38 every 10 nanoseconds or so. Each photon emission peaks comprises between about 160 and 200 detected photons at the various time intervals. The histogram also shows numerous other photon emission detections. Because photons emitted from transistors occur at regular intervals and in generally the same location, when enough photon emissions are detected (e.g., 10 million or more) a pattern of photon emission peaks (photon emissions that occurred at about the same time in the same area) may emerge over the background noise for a well-defined channel. Thirty-six million photons were collected to generate the image illustrated in FIG. B and the histogram illustrated in FIG. C. As the background emissions are random, the user may assume that the photon emissions detected at a regular interval are from one or more switching transistors. For testing of the IC, the timing pattern of the photon emission peaks may be used to determine the switching frequency of the transistor, the time when the transistor switched, and may be compared to other transistor photon emission histograms.

Thus, while conventional probe systems provide extremely useful testing information, the time required to obtain that information can be very long.

SUMMARY OF THE INVENTION

Aspects of the present invention dramatically reduce the time required to acquire a sufficient number of transistor emitted photons to extract useful information. Implementations of the present invention can be used to rapidly discriminate between photons emitted from transistors and background photon emissions. Implementations of the present invention may also be used to rapidly extract transistor timing information. In some instances, data acquisition times can be reduced from several hours or days, to only several minutes. With such reductions in acquisition time, emission data from an entire IC may be obtained in the time it would take to obtain data for only a single discrete area of an IC, and probe systems may be used to acquire data for numerous ICs in the time it would take to acquire data for a single IC. By shortening the time for testing and debugging of ICs, chip makers can bring new products to market faster than with conventional probe systems, can identify and rectify faults faster than with conventional probe systems, and can realize numerous other advantages.

Implementations of the present invention also automatically identify transistors from photon emission data. Upon automatic identification of transistors, histograms for all identified transistors may be automatically generated. This eliminates the need for a user to visually determine which photon data might be from a transistor, manually select the photon emission data, and then generate a histogram. Moreover, the number of photons required to obtain highly accurate transistor timing information is dramatically reduced.

One aspect of the present invention involves a method for analyzing photon emission data to discriminate between photons emitted from a transistor and photons emitted from other sources, the photon emission data comprising a first photon emission and at least one second photon emission, each photon emission comprising a spatial component corresponding with the space where each photon was detected and a temporal component corresponding with the time when each photon was detected. The method comprises correlating the first photon emission with the at least one second photon emission; and assigning a weight to the first photon emission as a function of the operation of correlating. The operation of correlating the photon emissions may further comprise comparing the spatial component of the first photon emission with the spatial component of the at least one second photon emission to determine if the spatial components are within a spatial range. The operation of correlating the photon emissions may further comprise comparing the temporal component of the first photon emission with the temporal component of the at least one second photon emission to determine if the temporal components are within a temporal range.

The operation of assigning a weight to the first photon emission may comprise assigning one weight value for each of the at least one second photon emissions that are spatially correlated, that are temporally correlated, or that are both spatially and temporally correlated.

Another aspect of the present invention involves a method for analyzing photon emissions to discriminate between photons emitted from a transistor and photons emitted from other sources, the photon emissions collected from a transistor using a detector having a transit time spread, the collected photon emissions comprising a spatial component and a temporal component corresponding with the space where each photon was detected and the time when each photon was detected. The method comprises receiving an indication of a group of photon emission data, the group being a subset of the collected photon emission data; processing the group of photon emission data to provide at least one temporal subgroup of photons having similar temporal characteristics; and determining a likelihood that photons within the temporal subgroup were emitted by a transistor.

The group of photon emission data may comprises a spatial subset of the collected photon emission data wherein the spatial subset of the collected photon emission data comprises each photon emission within a spatial range.

The operation of processing the group of photon emission data to provide at least one temporal subgroup of photons having similar temporal characteristics may further involve aggregating photon emissions in discrete time bins, or convolving the group of photon emission data with a normalized gate function, a triangle function, a Gaussian function, or the like. The operation of determining a likelihood that photons within the temporal subgroup were emitted by a transistor may further involve N-level thresholding or probability thresholding as described herein.

Another aspect of the present invention involves a method for analyzing photon emissions collected from a transistor discriminate between photons emitted from a transistor and photons emitted from other sources, the collected photon emissions comprising a spatial component and a temporal component corresponding with the space where each photon was detected and the time when each photon was detected. The method comprises spatially correlating the collected photon emissions data; temporally correlating the collected photon emission data; and determining a likelihood that all or a portion of the spatially correlated photon emission data originated from a transistor photon emission.

The spatial correlation may involve a method for autochanneling as discussed with reference to FIGS. 15 and 16. The temporal correlation may involve the operations discussed with reference to FIGS. 3A–3B, or may involved some of the operations discussed with reference to FIGS. 9 and 11. The likelihood operation may involve the operations discussed with reference to FIGS. 3A–3B and/or the operations discussed with reference to FIGS. 5A–5C. The likelihood operations may also involve assigning a weight to the photons as a function of the spatial and or temporal correlations.

Aspects of the present invention may also involve any of the operations and methods described with reference to FIGS. 1–16, individually or in combination. For example, aspects of the present invention involve the method for autochanneling described with reference to FIGS. 15 and 16.

A probe system or other system or apparatus conforming to the present invention may comprise program code, which when executed, performs some or all of the operations, alone or in combination, discussed in regard to the above described methods, or discussed in the detailed description set forth below. In one implementation, the program code may be implemented in non-volatile memory.

These and other features, embodiments, and implementations of the present invention will be described hereafter.

BRIEF DESCRIPTION OF THE DRAWINGS

FIG. A (Background) is a diagram illustrating a CMOS transmitter emitting photons;

FIG. B (Background) is a diagram of an image of photon emission data taken from a conventional probe system, the photon emission data overlaid on a laser scanning microscope diagram, the diagram further illustrating a manually defined channel around one concentration of photon emissions;

Figure 1:
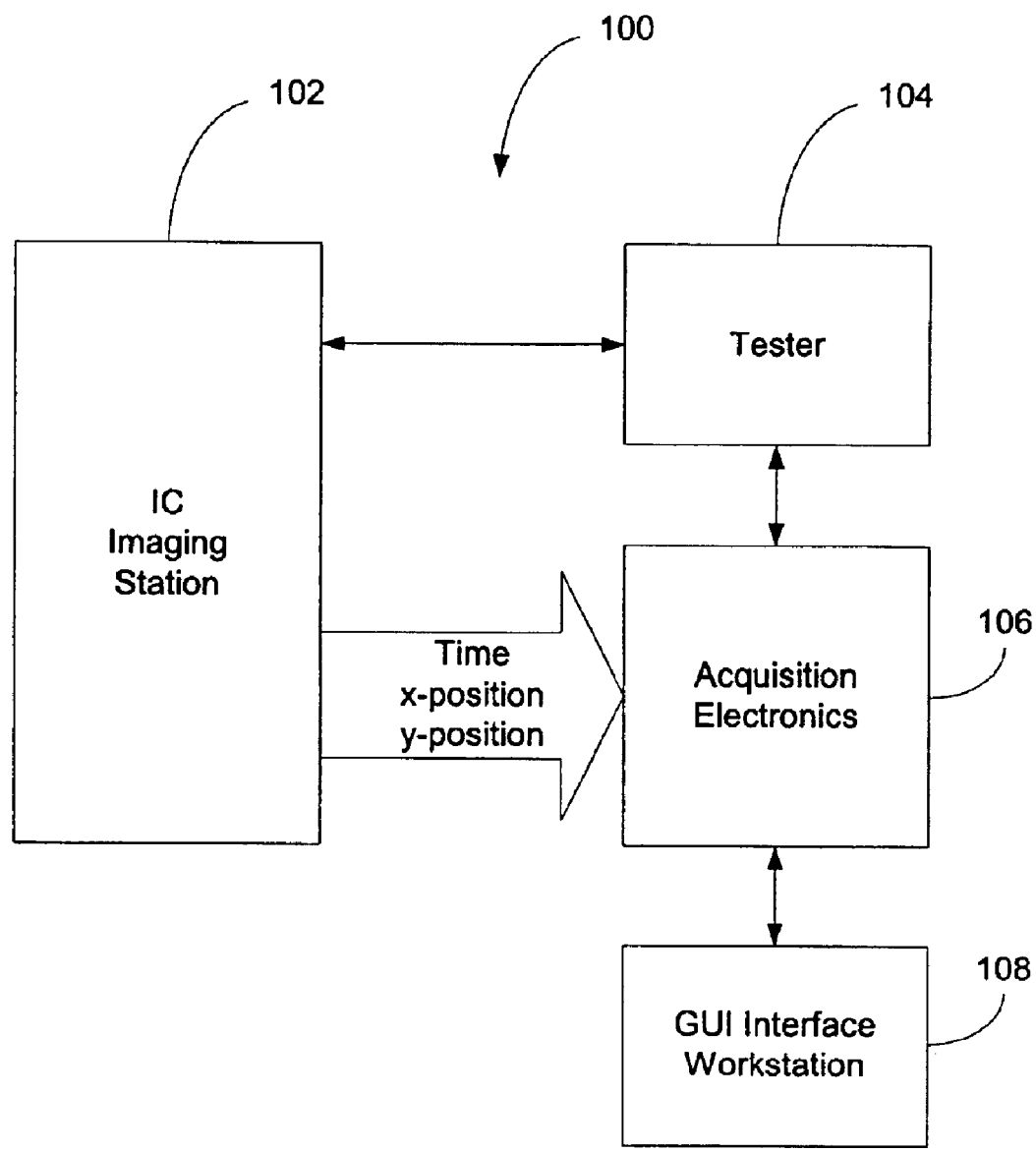
Figure 2:
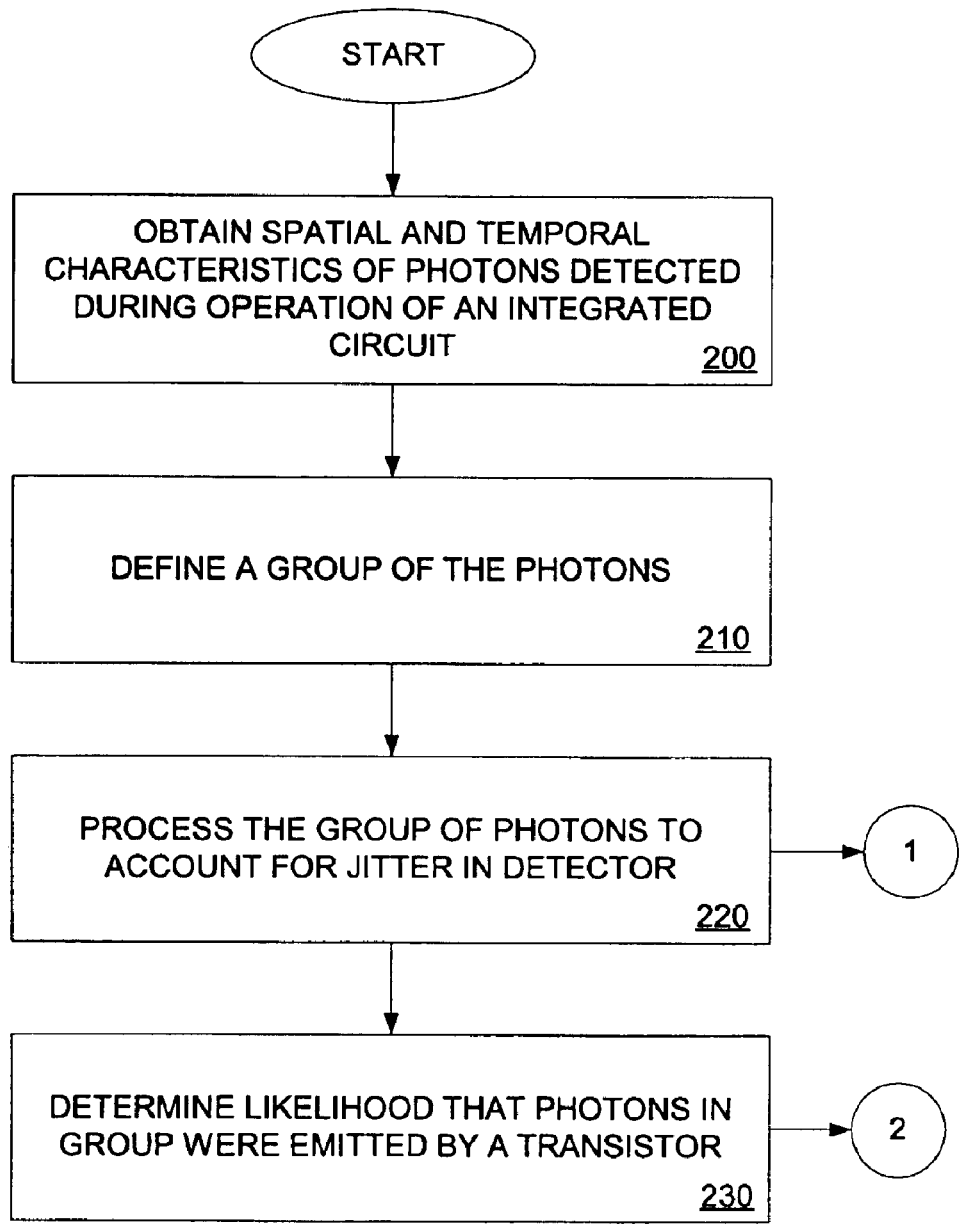
Figure 3A:
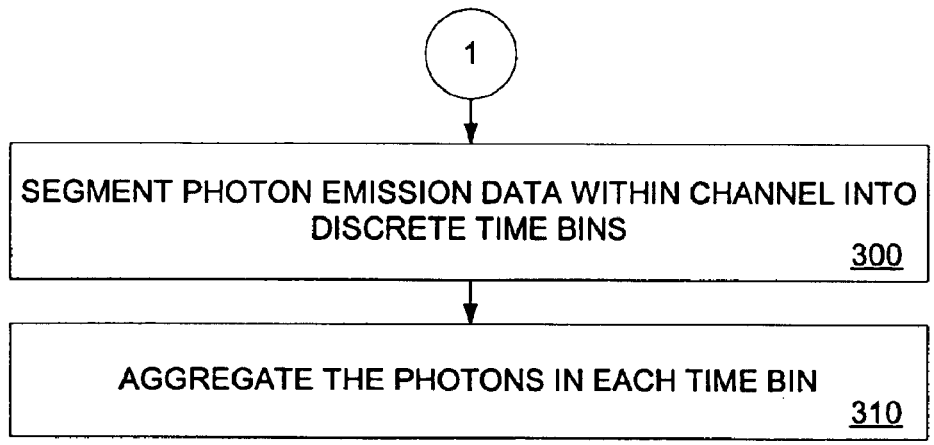
Figure 3B:
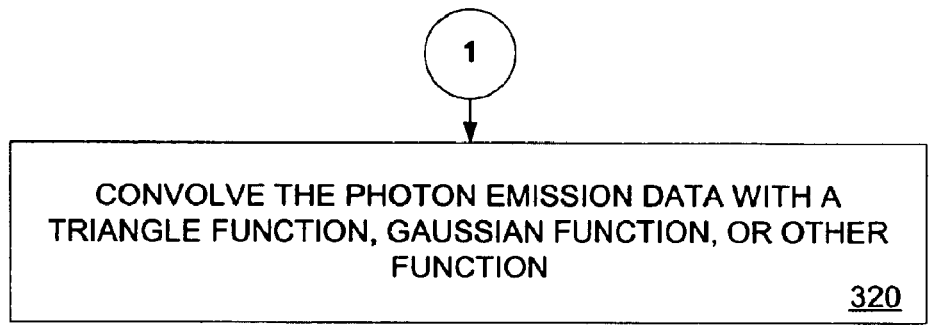
Figure 3C:
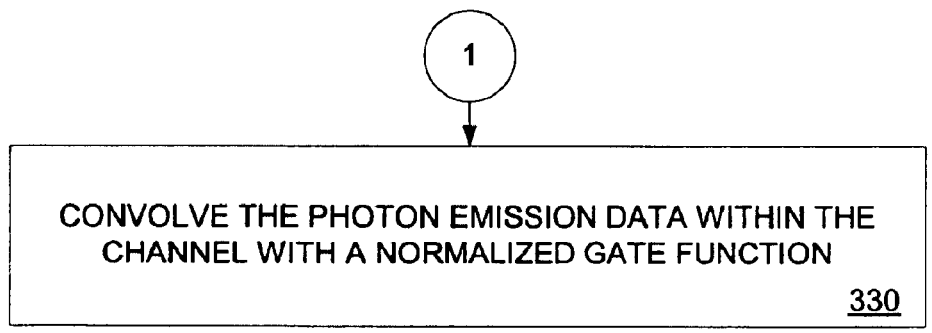
Figure 5A:
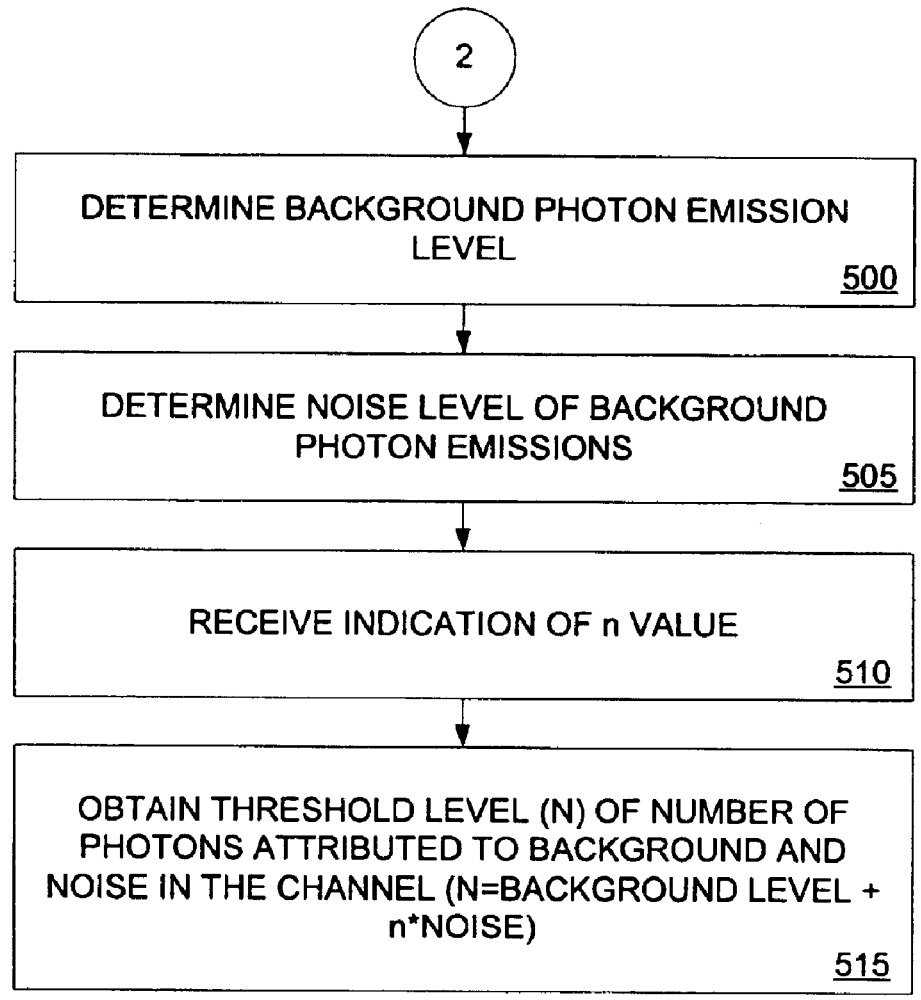
Figure 5B:
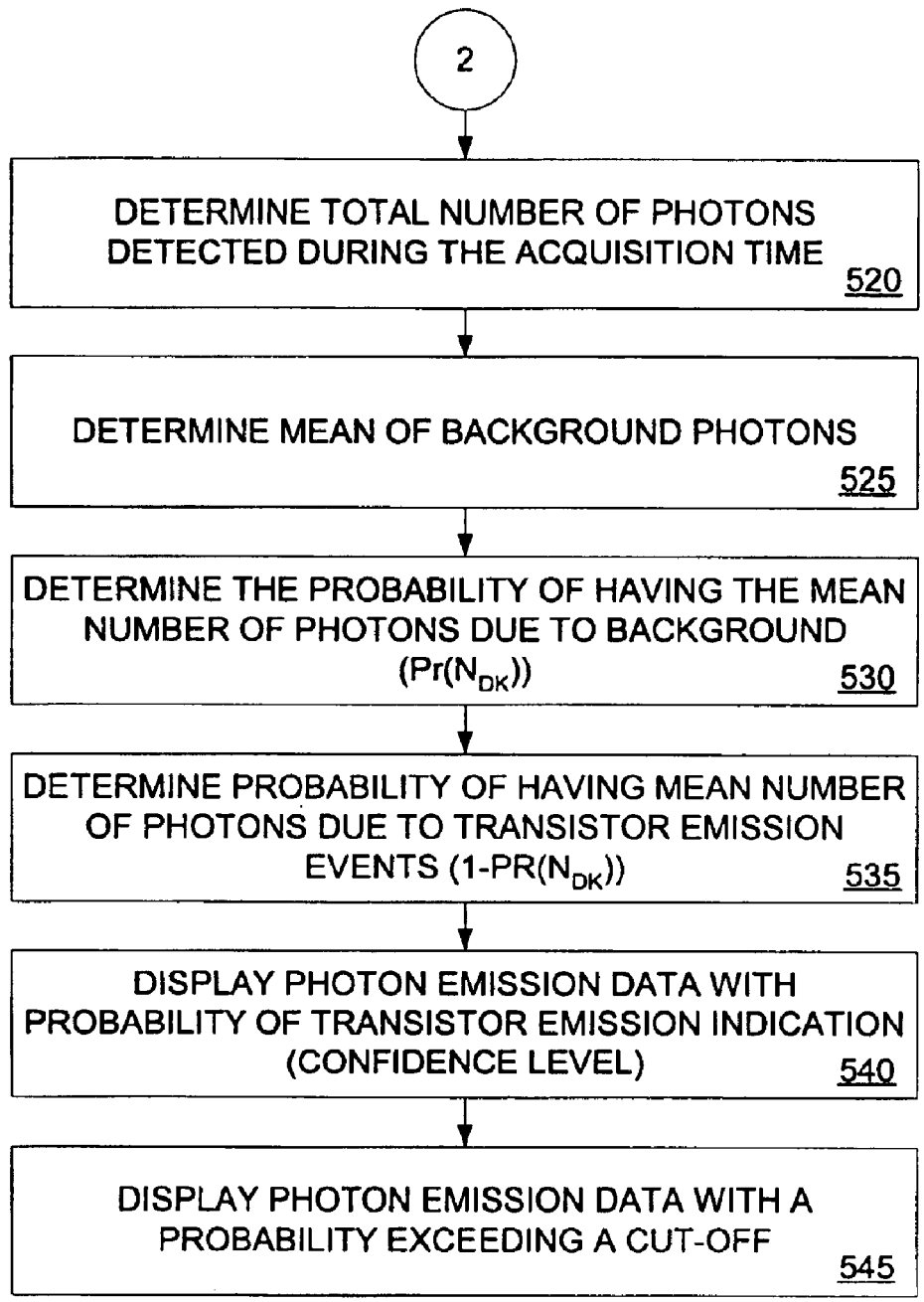
Figure 5C:
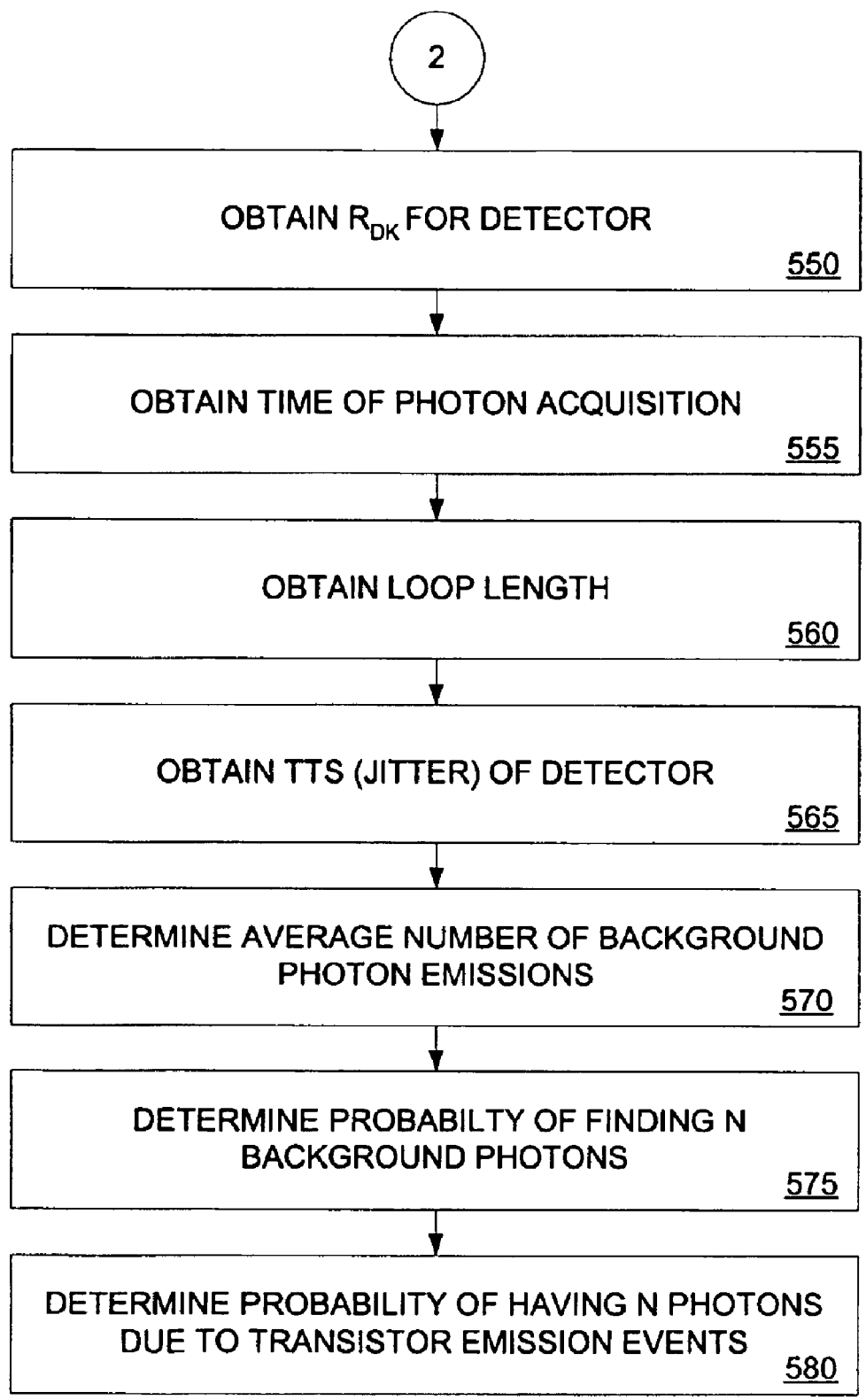
Figure 6:
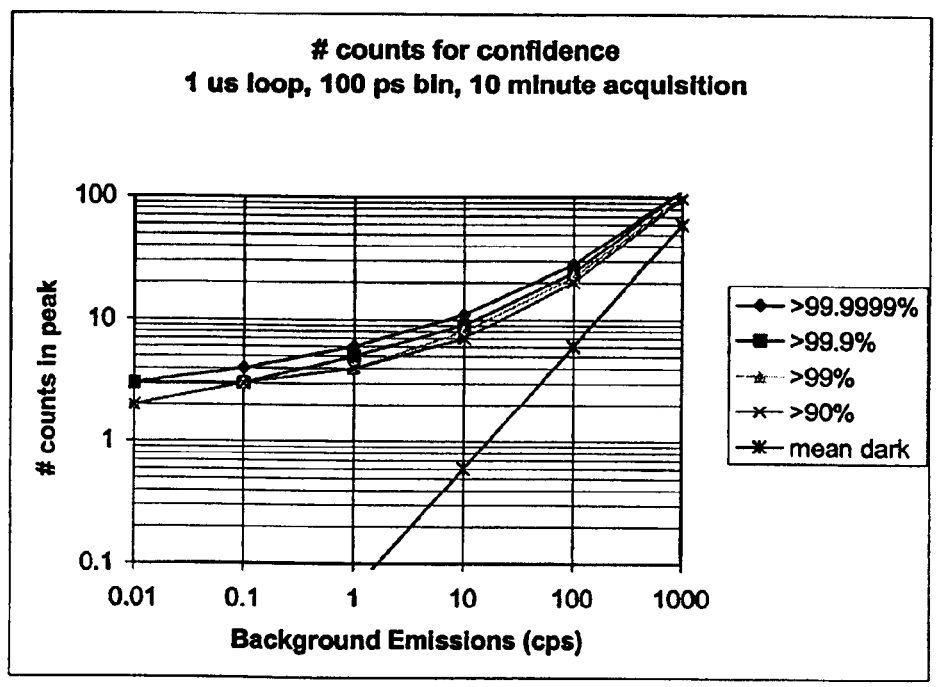
Figure 7A:
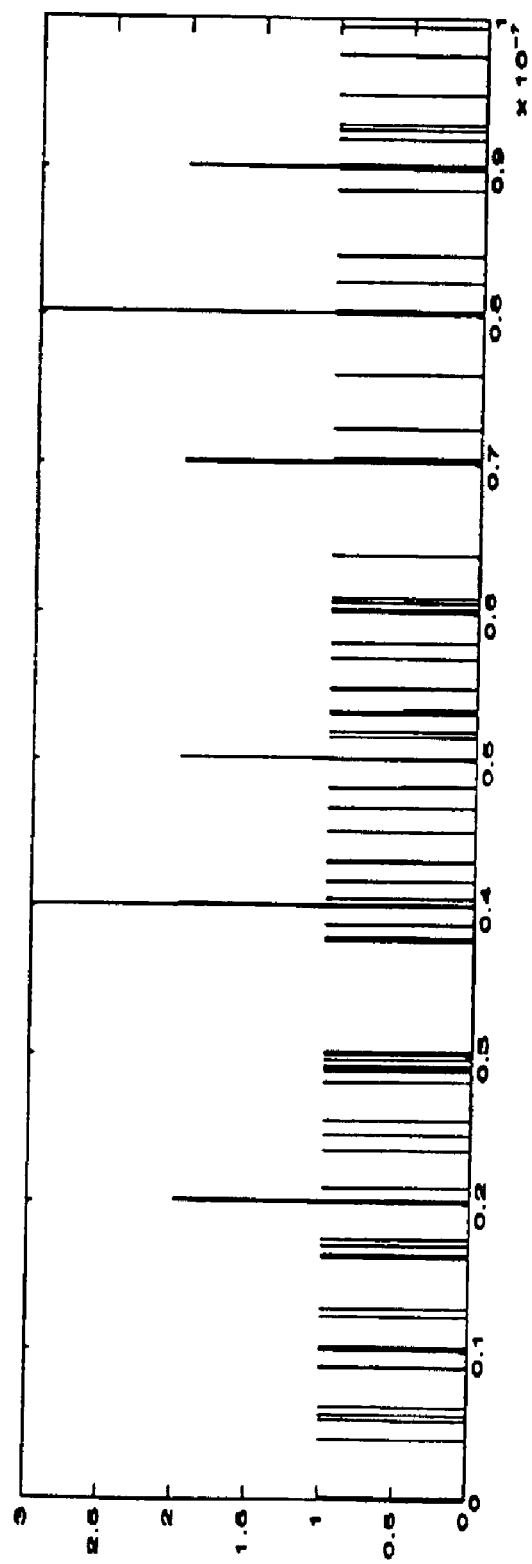
Figure 7B:
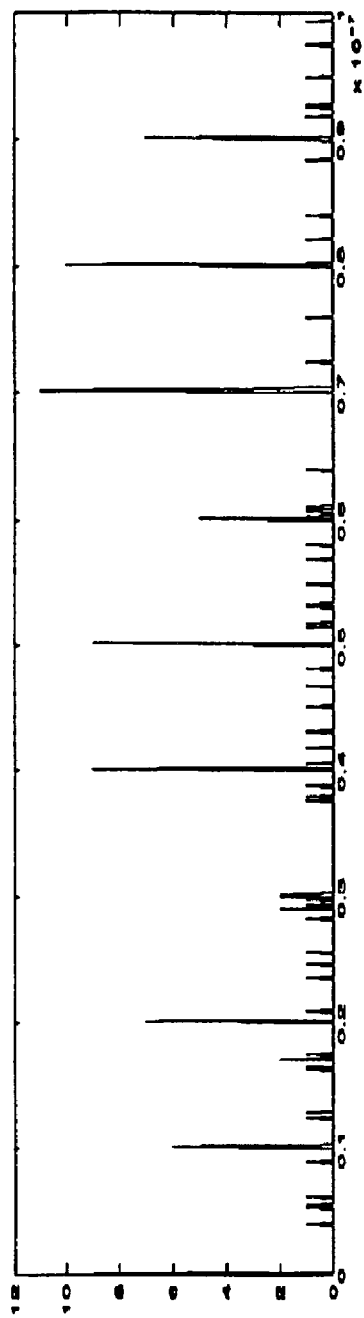
Figure 7C:
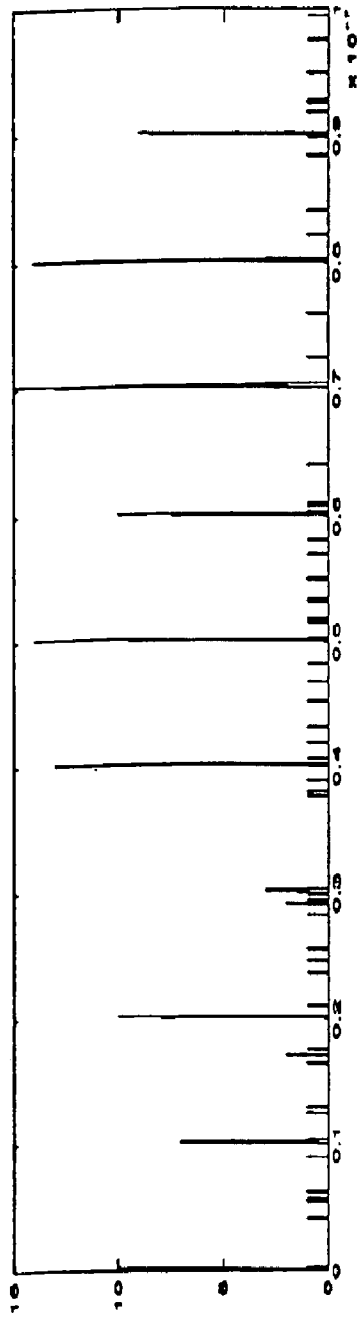
Figure 7D:
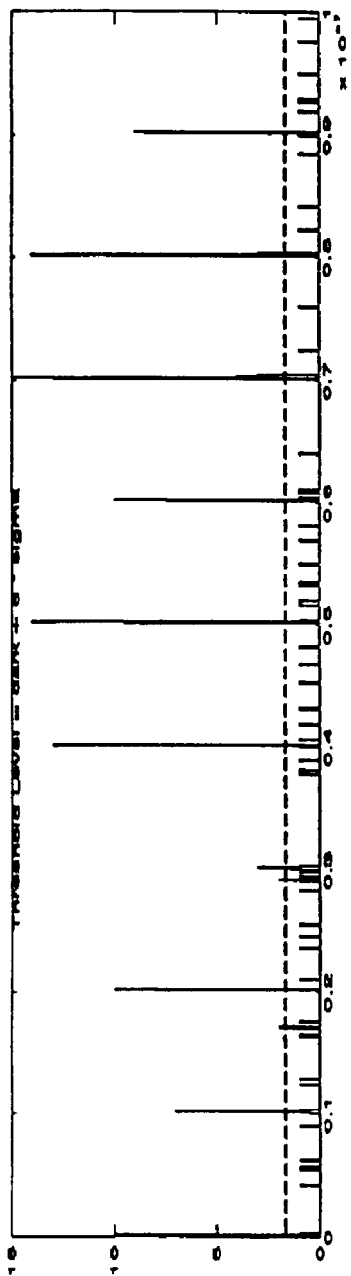
Figure 7E:
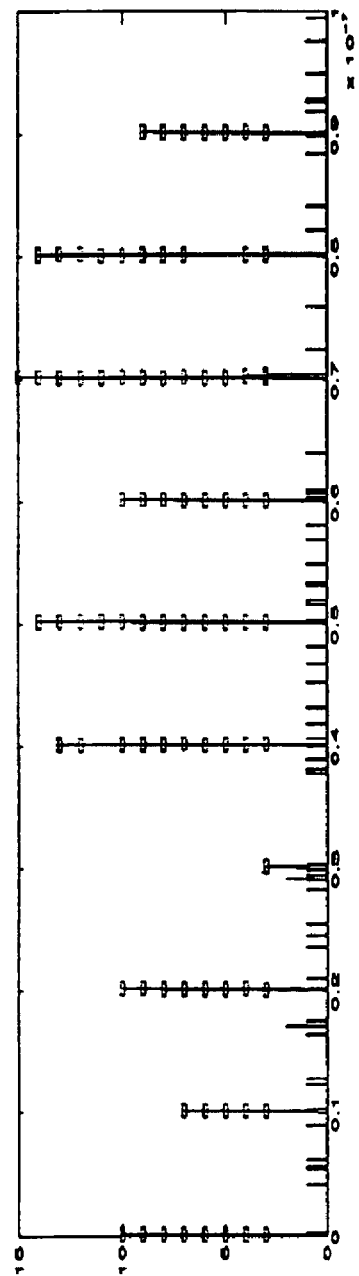
Figure 8:
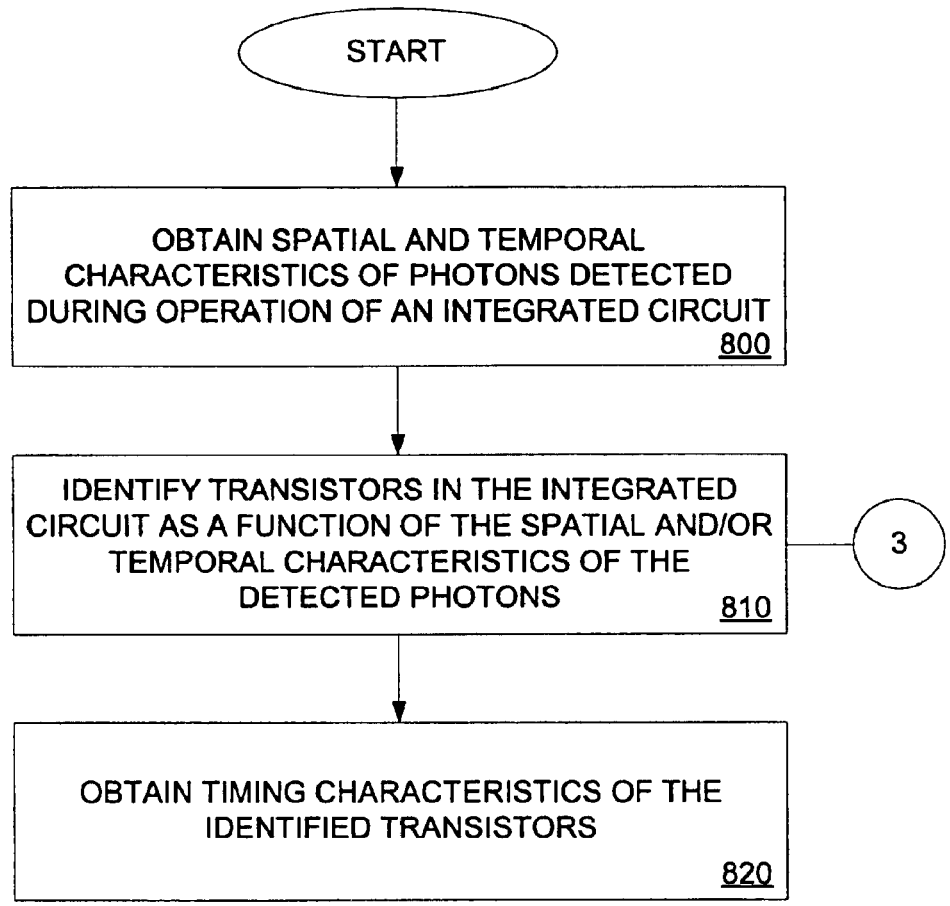
Figure 9:
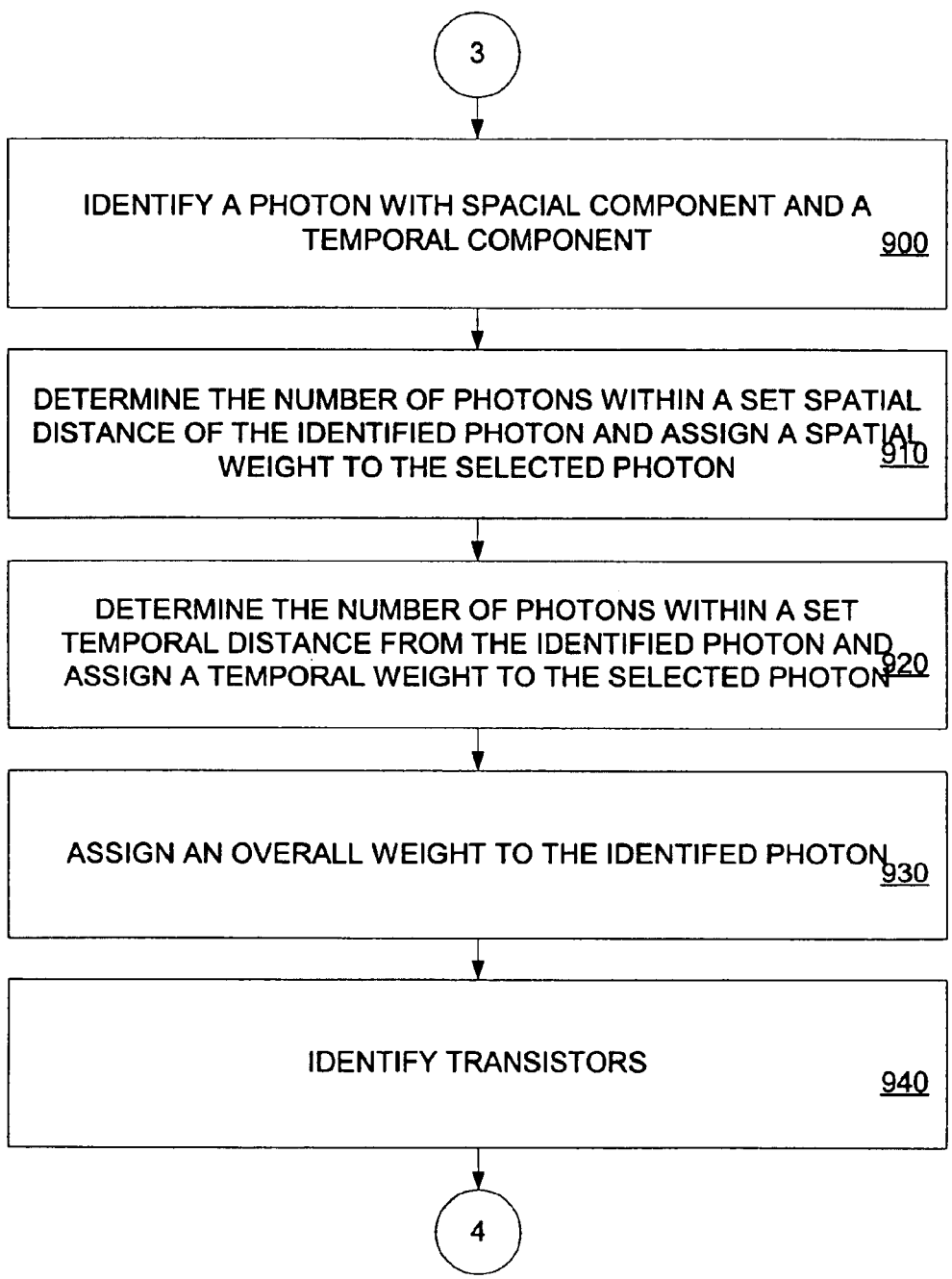
Figure 10A:
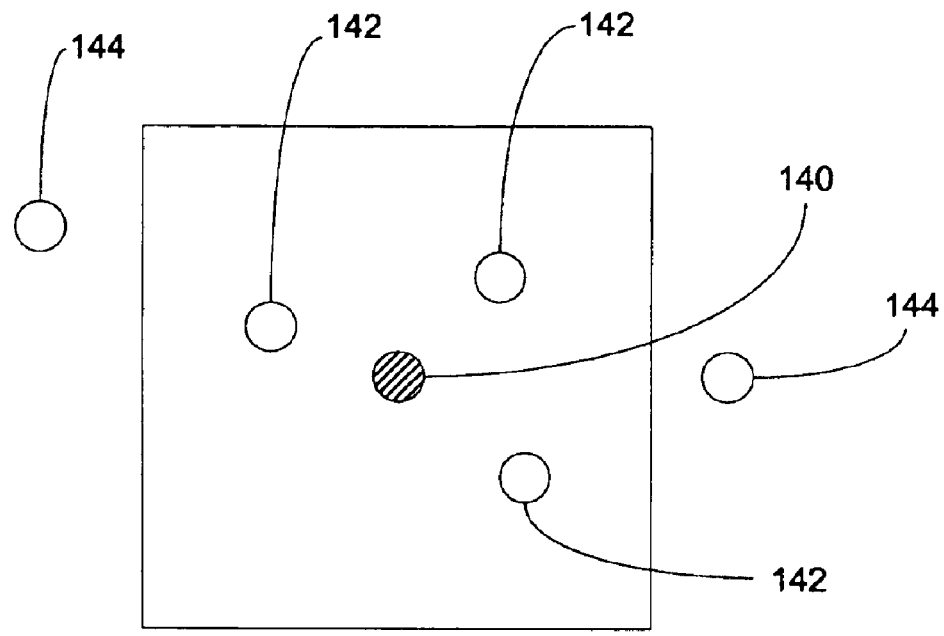
Figure 10B:
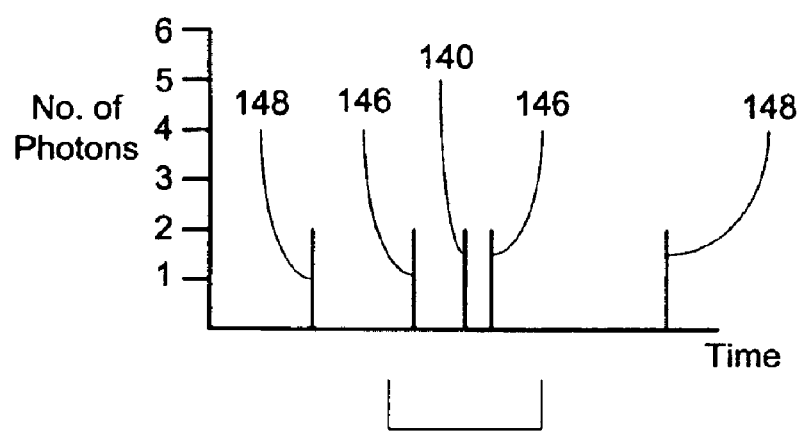
Figure 11:
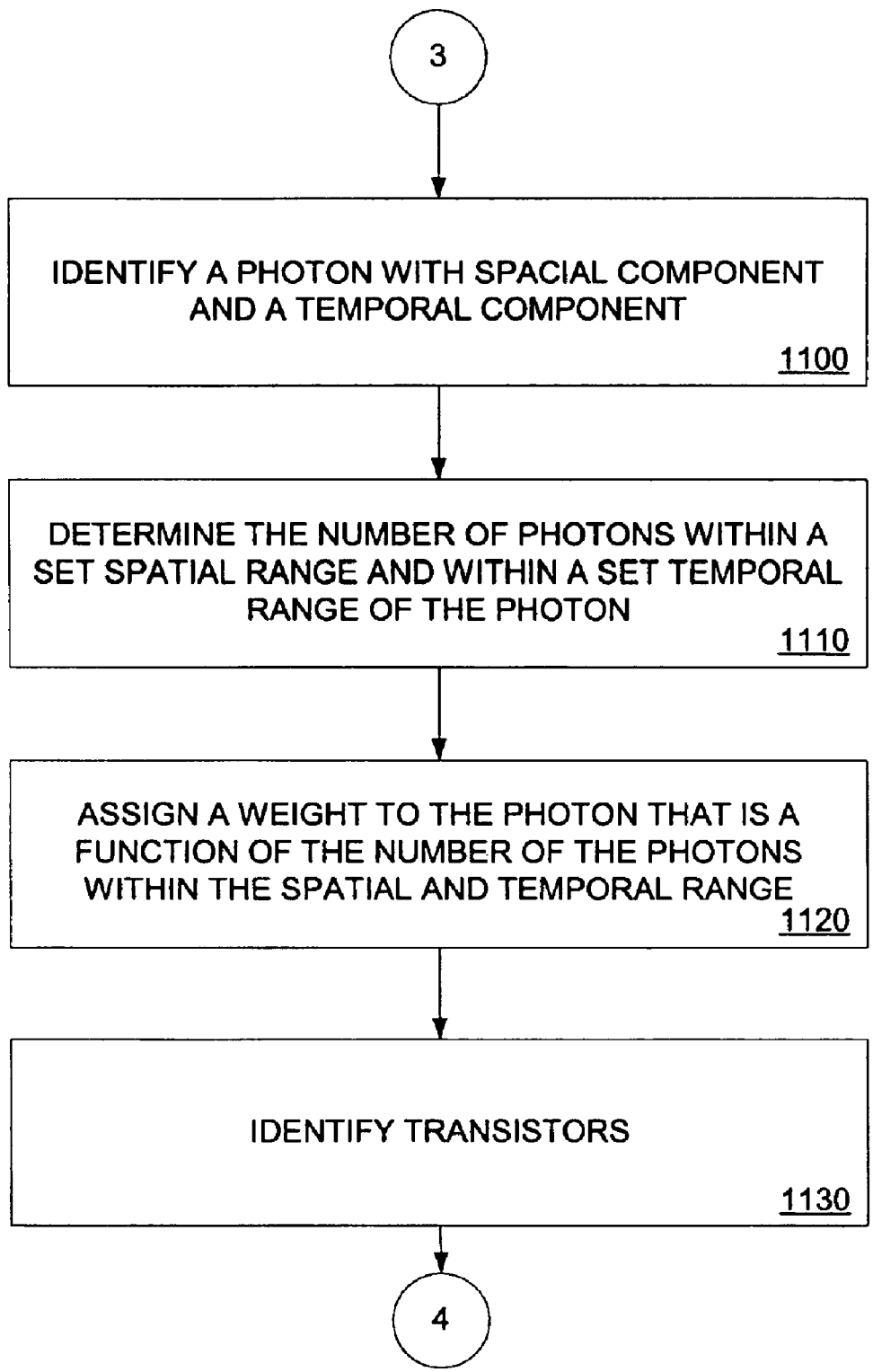
Figure 12A:
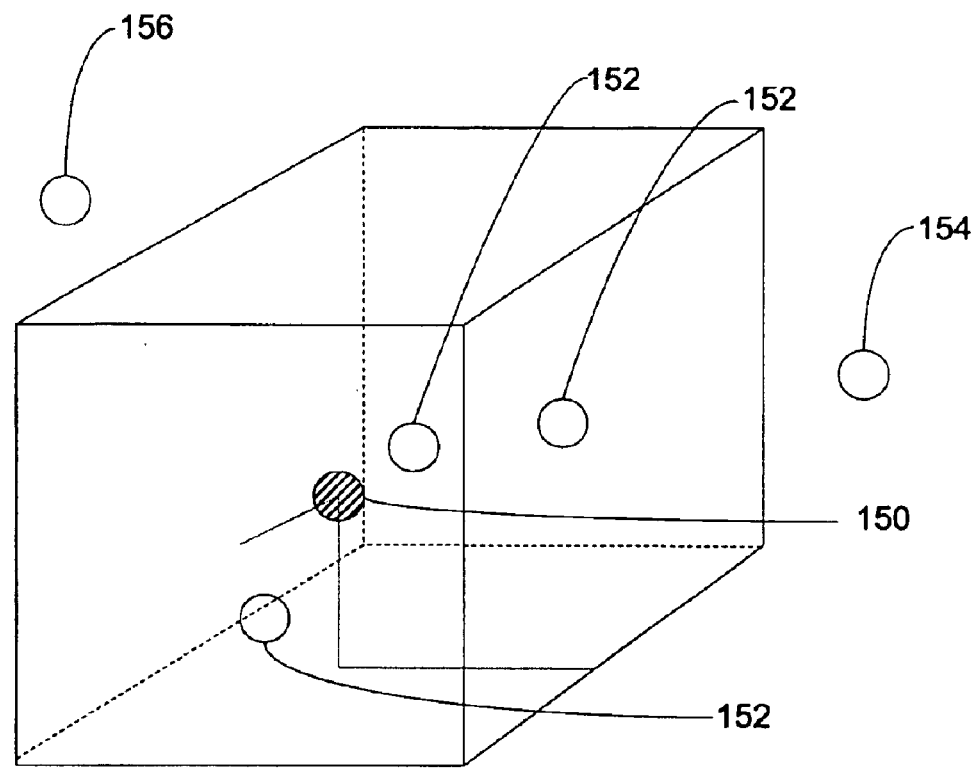
Figure 12B:
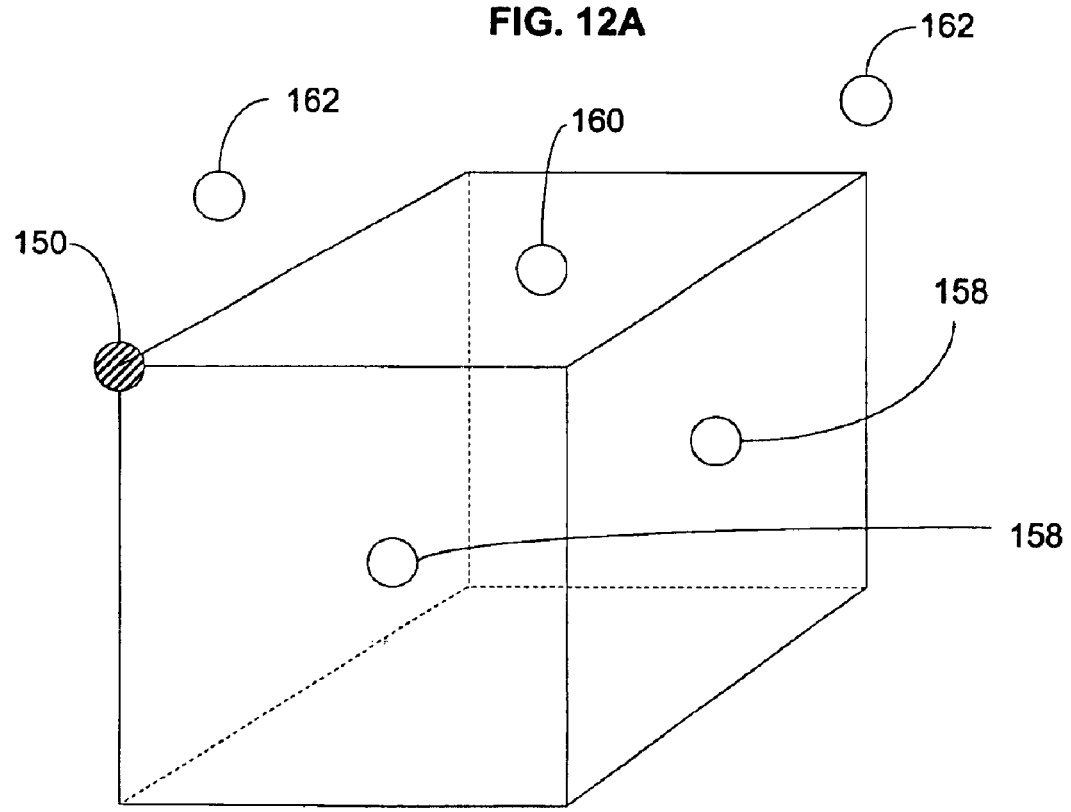
Figure 13:
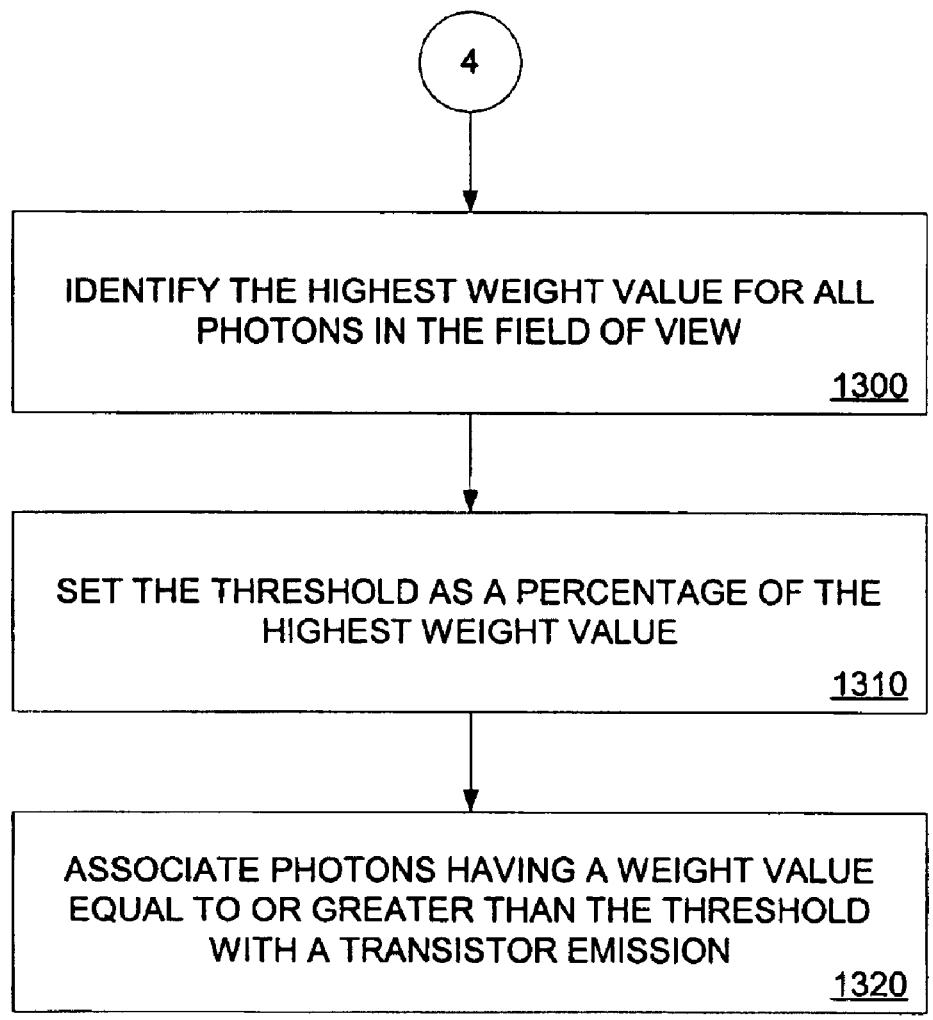
Figure 14A:
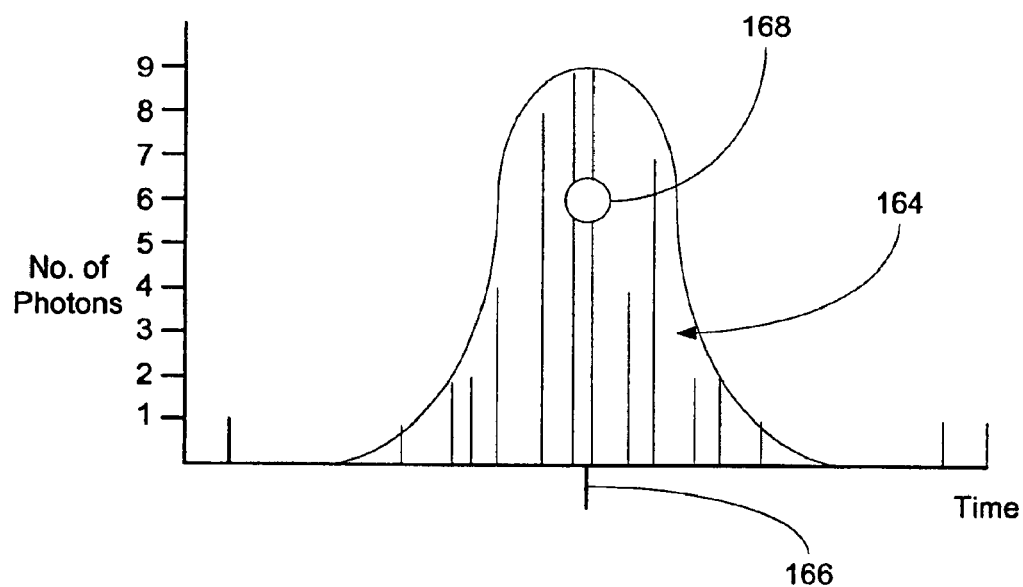
Figure 14B:
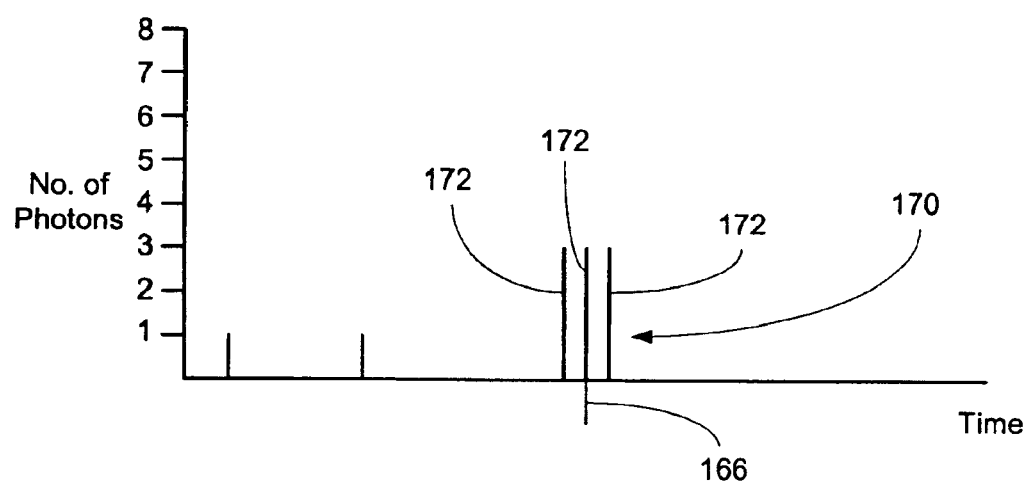
Figure 15:
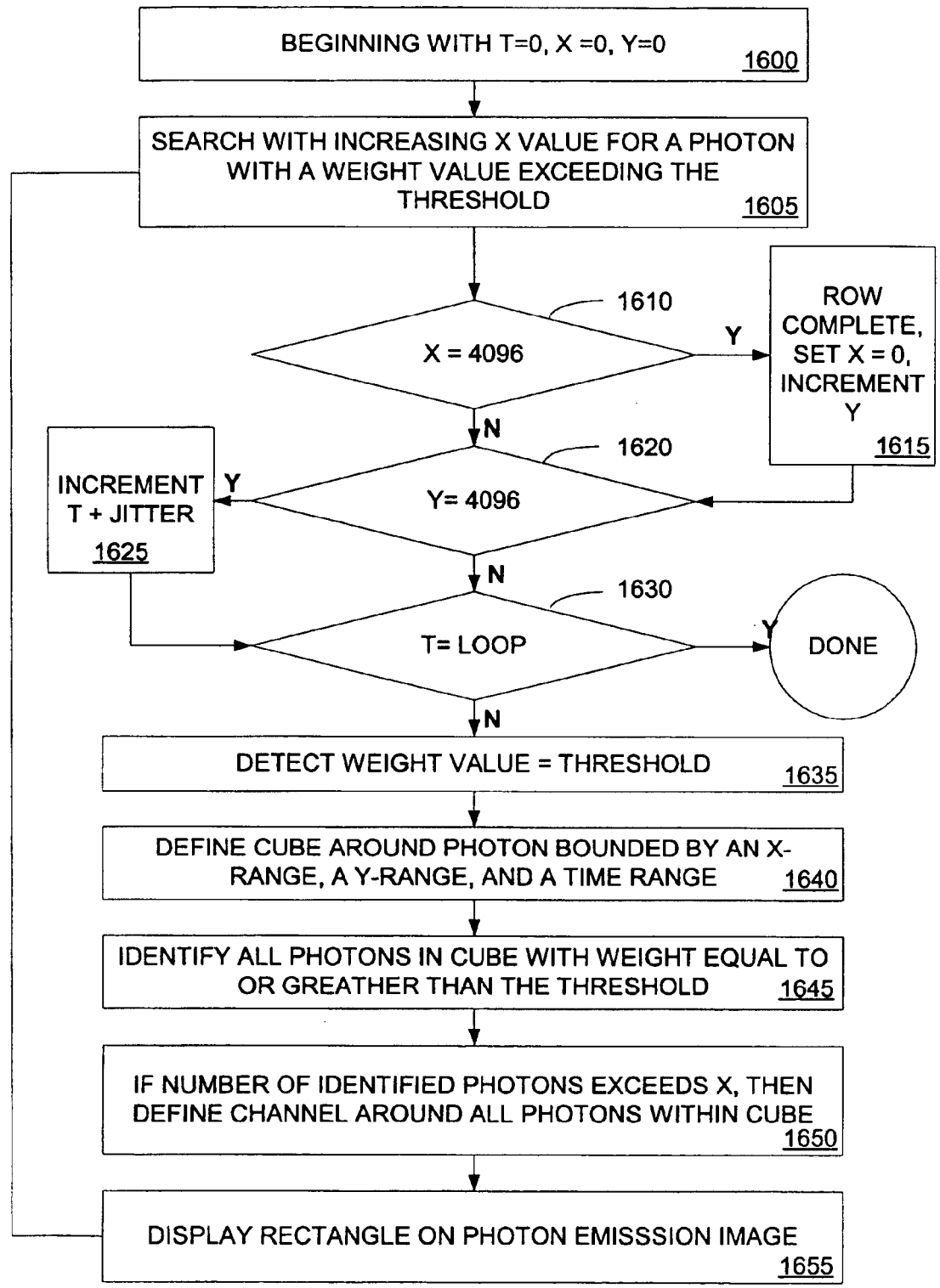
Figure 16:
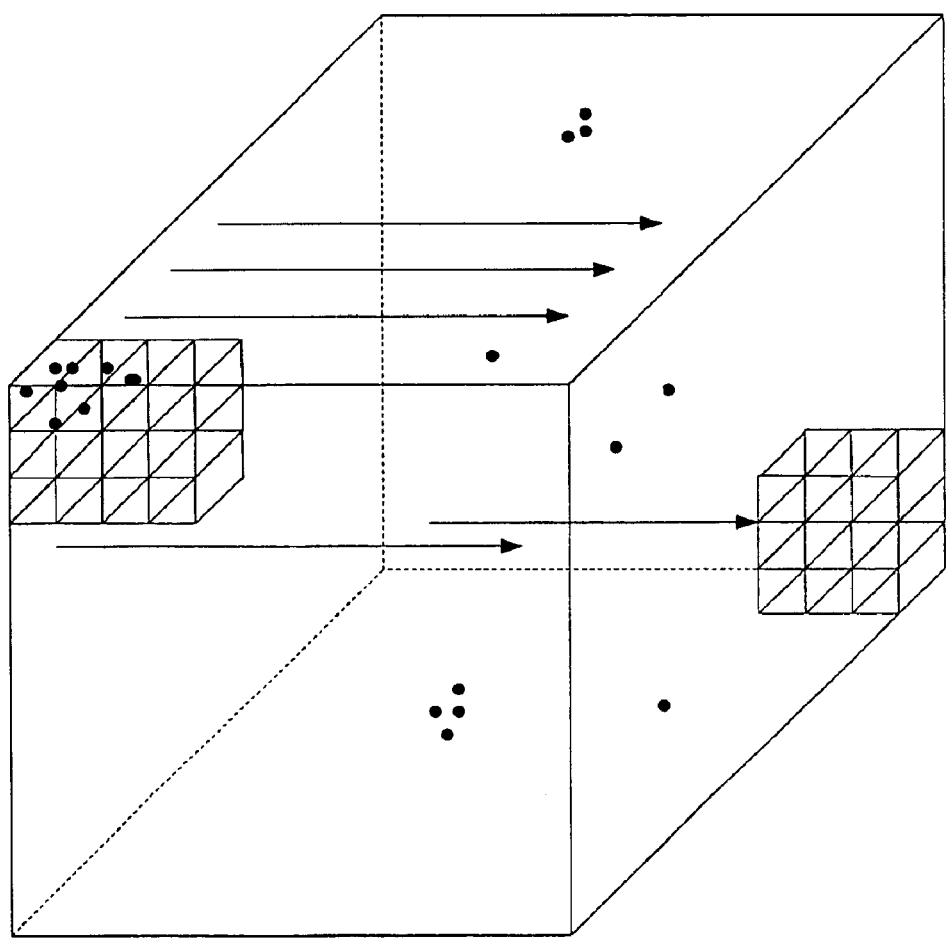

FIG. C (Background) is a histogram of the photon emission data within the channel illustrated in FIG. A, the histogram having time defined along the x-axis and the number of photons defined along the y-axis;

FIG. 1 is a block diagram of a probe system, in accordance with one embodiment of the present invention;

FIG. 2 is a flowchart illustrating the operations involved in a method for analyzing photon emission data to determine the likelihood that the photons were emitted by a transistor, in accordance with one embodiment of the present invention;

FIG. 3A is a flowchart illustrating a method for processing photon emission data to account for jitter in the detector by aggregating photon emissions in time bins, in accordance with one embodiment of the present invention;

FIG. 3B is a flowchart illustrating a method for processing photon emission data to account for jitter in the detector by convolving the photon emission data with a triangle function, Guasssian function, or the like, in accordance with one embodiment of the present invention;

FIG. 3C is a flowchart illustrating a method for processing photon emission data to account for jitter in the detector by convolving the photon emission data with a normalized gate function, in accordance with one embodiment of the present invention;

FIG. 4A is a diagram illustrating a histogram of photon emission recordation timing, the diagram further illustrating a plurality of time bins, in accordance with one embodiment of the present invention;

FIG. 4B is a diagram of the histogram of FIG. 4A, after the photons are collected in the time bin and summed, in accordance with one embodiment of the present invention;

FIG. 5A is a flowchart illustrating a method for determining a likelihood that photons were emitted by a transistor, in accordance with one embodiment of the present invention;

FIG. 5B is a flowchart illustrating an alternative method for determining a likelihood that photons were emitted by a transistor, in accordance with one embodiment of the present invention;

FIG. 5C is a flowchart illustrating a second alternative method for determining a likelihood that photons were emitted by a transistor, in accordance with one embodiment of the present invention;

FIG. 6 is a graph illustrating the confidence or probability relationship between the background photon emission of a probe system detector and the number of photons detected in a discrete time period, in accordance with one embodiment of the present invention;

FIG. 7A is a histogram of the number of photons collected at various time points for a portion of 80,000 total collected photons at a sampling rate of 2.5 ps, for 0.18 um CMOS technology arranged in an inverter configuration running a test sequence at 100 MHz in a 100 ns loop;

FIG. 7B is a histogram of the photon emission data illustrated in FIG. 7A processed in accordance with the method of FIG. 3A;

FIG. 7C is a histogram of the photon emission data illustrated in FIG. 7A processed in accordance with the method of FIG. 3C;

FIG. 7D is a histogram of the photon emission data illustrated in FIG. 7A processed in accordance with the methods of FIG. 3A and FIG. 5A;

FIG. 7E is a histogram of the photon emission data illustrated in FIG. 7A processed in accordance with the methods of FIG. 3C and FIG. 5B;

FIG. 8 is a flowchart illustrating a method for automatically identifying transistors from photon emission data and obtaining histogram data for the identified transistors by correlating photons spatially, temporally, or spatially and temporally, in accordance with one embodiment of the present invention;

FIG. 9 is a flowchart illustrating a method for assigning a weight to a photon emission as a function of the spatial correlation with other photons, a function of the temporal correlation with other photons, and as a function of the spatial and temporal correlation with other photons, in accordance with one embodiment of the present invention;

FIG. 10A is a diagram illustrating one method for spatially correlating photon emissions, in accordance with one embodiment of the present invention;

FIG. 10B is a diagram illustrating one method for temporally correlating photon emissions, in accordance with one embodiment of the present invention;

FIG. 11 is a flowchart illustrating a method of assigning a weight to a photon emission as a function of the spatial and temporal correlation with other photons, in accordance with one embodiment of the present invention;

FIG. 12A is a diagram illustrating a method for spatially and temporally correlating photon emissions, in accordance with one embodiment of the present invention;

FIG. 12B is a diagram illustrating a second method for spatially and temporally correlating photon emissions, in accordance with one embodiment of the present invention;

FIG. 13 is a flowchart illustrating a method for establishing a threshold value, photons having a weight above which are attributed to transistor emissions, in accordance with one embodiment of the present invention;

FIG. 14A is a histogram illustrating photon emissions around one discrete time point for conventionally obtained photon emission data;

FIG. 14B is a histogram illustrating photon emissions around one discrete point for photon emission data correlated in accordance with the method illustrated in FIG. 13;

FIG. 15 is a flowchart illustrating the operations involved in a method for auto channeling, in accordance with one embodiment of the present invention; and FIG. 16 is a diagram illustrating the method for auto channeling described with reference to FIG. 15.

DETAILED DESCRIPTION OF EMBODIMENTS OF THE INVENTION

The present invention involves apparatuses and methods for analyzing photon emissions from an integrated circuit (IC) to identify transistors and extract timing information. Implementations of the present invention process photon emission data to rapidly discriminate between photons emitted by a transistor and photons attributable to background emissions. Generally, various aspects of the invention involve the correlation, grouping, or association of photons that have the same or similar spatial, temporal, spatial and temporal and other characteristics to discriminate between photons emitted from a transistor and randomly distributed background photon emissions. The discrimination between transistor photon emissions and background photon emissions can be used to identify a likelihood that photons were emitted from a transistor, identify a single transistor, identify many transistors in an entire IC or a portion of an IC, and extract timing information for the transistor or transistors.

FIG. 1 is a schematic block diagram illustrating a diagnostic and testing optical imaging probe system 100 (hereafter "probe system") for gathering and recording photon emissions from one or more complimentary metal oxide semiconductor (CMOS) transistors in an IC. One such probe system that may employ aspects of the present invention is described in U.S. Pat. No. 5,940,545 entitled "Noninvasive Optical Method for Measuring Internal Switching and Other Dynamic Properties of CMOS circuits." A commercially available probe system that may employ aspects of the present invention is the NPTest or Schlumberger IDS PICA (Picosecond Imaging Circuit Analysis) probe system.

The probe system detects and records the time and position of photons being emitted from switching CMOS transistors. The probe system 100 includes an IC imaging station 102 that provides optical image data of an IC under test. The probe system 100 also includes a testing platform 104 that provides a testing sequence to the IC under test. Generally, the testing sequence provides a known signal pattern at the inputs of the IC that generates a known output pattern at the outputs of a properly functioning IC. Due to the low probability of detecting a photon emission, the testing sequence may be looped for a period of time. In response to the testing sequence, the IC under test executes various operations, which involves the commutation or switching of CMOS transistors. Each time a CMOS transistor commutates, there is a chance it will emit a photon. The IC imaging station 102 is configured to detect the emitted photon, and transmit the spatial location and the time at which it received the photon to an acquisition electronics platform 106. A graphical user interface (GUI) 108 is accessible through a workstation connected with the probe system 100. The GUI may be used to manipulate photon emission data collected by the IC imaging station 102.

The IC imaging station 102, in one implementation, includes a detector that has a field of view of 4096 pixels by 4096 pixels, which may be used to obtain photon emission data for an IC area of about 160 microns by 160 microns. Such an area may include any number of discrete CMOS transistors. The physical dimensions of CMOS transistor gate lengths are constantly shrinking. Currently, a CMOS transistor gate length may be as small as 0.13 microns. Hence, taking into account some space between transistors and the presence of ring guards, there could be thousands of CMOS transistors in the 160 micron by 160 micron portion of the IC within the field of view. The field of view includes an x-axis (the horizontal axis) and a y-axis (the vertical axis). The pixel location that captures an emitted photon includes an x-position and y-position. The (x, y) position where the photon is detected is transmitted to the acquisition electronics 106. In addition, the probe system 100 captures the time (t) at which the photon is detected, which is also transmitted to the acquisition electronics 106.

Typically, the pixel location associated with the capture of an emitted photon is above the transistor that emitted it. The photon, however, may not be detected directly above the portion of the transistor that emitted the photon because the photon may be emitted at an angle. In addition, as discussed in more detail below, the time at which a photon is detected may be offset by the jitter of the detector. Thus, the exact spatial and temporal location that a photon is detected may be different than the location and time of its transmission.

FIG. 2 is a flowchart illustrating the operations involved in a method for analyzing photon emission data captured by the probe system to discriminate between transistor photon emissions and background photon emissions, in accordance with one embodiment of the invention. The method described with reference to FIG. 2 and other related figures and FIG. 8 and other related figures may be generally considered as methods for event detection. The various methods described herein are discussed with reference to implementation in the probe system of FIG. 1. The method illustrated in the FIG. 2 flowchart along with the other methods described herein, all in accordance with various aspects of the present invention, may also be implemented as executable software code. The code may be adapted to run on the workstation connected with the probe system, run on a server connected to a network accessible by one or more processing devices, and on a standalone processing device (such as a personal computer, workstation, or the like). The code may also be recorded on a computer readable medium, such as a floppy disk, CD-ROM, RAM, ROM, and the like.

The user of a probe system employing a method conforming to the present invention can rapidly discriminate between photons emitted from a transistor and photons emitted from background sources. Such discrimination may be used to identify functioning transistors useful in locating faults in a dense array of CMOS transistors located in an IC. A probe system employing aspects of the present invention may provide a conventional timing mode, which causes the probe system to obtain enough photon data to extract precise timing information for an IC under test as is known in the art, and an event detection mode configured to execute one or more of the methods described herein, alone or in combination, which causes the probe system to obtain enough photon data to determine whether a transistor is switching. As will be discussed below, embodiments of the present invention are also capable of extracting precise timing information from switching transistors in much shorter time periods than conventional probe systems. Thus, a probe system may employ a timing mode configured to cause the probe system to obtain photon data and process the photon data in accordance with an embodiment of the invention rather than conventional methods.

Referring again to FIG. 2, first, the probe system 100 obtains spatial and temporal characteristics for the photons detected while an IC is being operated (200). As discussed above, to generate photon emissions, a test sequence is run in a loop on the IC under test. The IC imaging station 102 collects all photons from switching transistors and background emissions during the test sequence. The photon emission data includes spatial and temporal characteristics for each photon detected by the detector while the IC is being tested. The spatial information is provided as an x-coordinate and a y-coordinate corresponding with the pixel location that detected the photon. The temporal information is provided as a time (t) value corresponding with the time that the photon was detected.

As mentioned above, the field of view of the detector may include a thousand or more CMOS transistors. After the photon emission data is obtained, a portion or subgroup of the photon emission data is selected for analysis (210). Generally, the subgrouping involves a spatially-based subgroup of all of the photons within the photon emission data. In one implementation, using the GUI 108, the user defines a channel on the photon image data. The channel may be defined by using a mouse manipulated pointer to draw a rectangle around an area of an image generated as a function of the photon emission data. The channel area is bounded by a range of x-values and a range of y-values, and all of the photons having an x-value and y-value within the channel are included in the channel. Alternatively, the subgroup or channel may be defined through a method for identifying transistors from photon emission data discussed below with reference to FIGS. 8–16.

The methods described herein with regard to FIGS. 2–7E process a subgroup of all of the photon emission data. In contrast, the methods described below with regard to FIGS. 8–15 may process all of the photon emission data. It will be recognized that the methods described with reference to FIGS. 2–7E may be adapted to process all of the photon emission data. The photon emission data collected by the IC imaging station may be analyzed in accordance with the methods described herein while the testing sequence is running and photon emissions are being collected by the IC imaging station or the data may be analyzed after the testing loop has been completed.

After defining the group of photons to analyze (210), the system processes the group of photon emissions to account for errors in the identification of the time at which the photons were detected (220). The processed data is then analyzed to determine the likelihood that the photons in the group were emitted by a transistor (230). Referring now to operation 220 of FIG. 2, to determine the likelihood that photons in a group were emitted by a transistor, an embodiment of the invention may take into account the background photon emission characteristics of the detector used to collect the photon emission data. Generally, if the background emission characteristics are understood, then the system may compare the photons in a particular group with the expected background photon emission characteristics and determine whether photons in the group are a part of the background emission or were likely emitted by transistors.

In some implementations of the present invention, the spatial subgrouping of the photon emission data (operation 210) is processed to account for errors in the identification of the time at which a photon was detected (220). Photon detectors, such as the PMT detector used in the IDS PICA system, have some error in the identification of the time at which a photon was detected, which is referred to as TTS (transmit time spread) or "jitter." In the presence of jitter, a photon that arrives at the detector at time t may be identified as having been received at some time before t or after t. For example, if the jitter of the detector is 80 ps (picoseconds), then the detection time for a photon may be anywhere within the range between t−40 ps and t+40 ps. Processing the photons to account for the jitter of the detector involves a temporal subgrouping of photons to prospectively associate photons emitted by a transistor with other photons emitted by the same transistor, even though those photons were not recorded at or very near the same time.

FIGS. 3A, 3B, and 3C are flowcharts illustrating various different ways to process photon emission data (referred to as "processed photon data") to account for the photon emission detection timing errors introduced by jitter. FIG. 3A is a flowchart illustrating a method involving the summation of photons falling with defined blocks of time. FIG. 3B illustrates the application of various filters to process photon emission data. FIG. 3C illustrates a method involving the convolution of photon emission data with a normalized gate function. As will be recognized, the methods discussed with reference to FIGS. 3A–3C may alone provide event detection, in accordance with one embodiment of the invention. As discussed further below, further processing of the photon emission data in accordance with the methods described with reference to FIGS. 5A, 5B, and 5C may also be performed to provide event detection.

Referring first to FIG. 3A, a flowchart is shown illustrating the operations involved in one method for processing the photon emission to account for the timing errors introduced by jitter. First, the system segments the spatially grouped photon emission data into one or more discrete time bins (300). The system then aggregates all of the photon emissions falling within one of the time bins (310). FIG. 4A illustrates a an example of a histogram for photon emission 110 and the time of their detection and a graphical illustration of a set of time bins 112. Generally, a time bin defines a continuous range of time within the total range of time for the photon emission data being processed. Typically, a plurality of time bins are defined such that all of the time bins account for at least the total range of time for the photon emission data being processed. For example, if a test sequence is run on an IC in a loop of 100 ns (nanoseconds), then the total range for the photon emission data collected for the IC will be 0 to 100 ns.

In some instances, the time bins may also be defined so that they overlap. In a detector with a 75 ps jitter, for example, the temporal recordation of photons emitted at the same time in the loop, may actually be recorded within 37.5 ps on either side of the actual detection. Thus, photons emitted from a single transistor at nearly the same time, may be recorded within a range of 75 ps. As will be recognized fully from the discussion below, it is important to capture the full temporal range of as many photons associated within a transistor emission as possible.

The present inventors recognized that background emissions are randomly spread about photon emission data both spatially and temporally. Thus, it is unlikely that there will be a high concentration of photon emission detections attributable to background in a discrete location spatially or temporally. Photons emitted from a transistor, however, are emitted from a spatially located transistor and at a temporal interval. Thus, even though photons may be deflected, emit at an angle, and emit from different spots on the transistor and even in the presence of jitter, photons emitted from a transistor are likely to be fairly closely grouped in both space and time. If a transistor photon emission occurs at the boundary between two time bins, then the photon might not be grouped with other photons emitted from the transistor. Thus, in some implementations of the present invention that employ time bins to compensate for error introduced by the detector, the time bins are defined in an overlapping manner so that transistor photon emissions might be grouped with other related transistor photon emissions.

Referring again to FIG. 4A, in this example, sixteen 75 ps wide time bins 112 are illustrated. Each time bin has a 10 ps overlap with adjacent time bins. These time bins are arranged beginning from time zero and extending along the 100 ns loop of the histogram. The first time bin 114 includes 0 ps to 75 ps, the second time bin 116 includes 65 ps to 140 ps, the third time bin 118 includes 130 ps to 205 ps, etc. The arrangement of time bins shown in FIG. 4A is just one possible arrangement. In another example, a time bin is defined as the same size as the jitter of the detector. In one particular implementation of the present invention, the time bins are defined around the sampling time points at the size of the jitter. If the sampling rate is 2.5 ps and the jitter is 80 ps, then the time bins would be 80 ps wide and centered around each sampling location. For 100 ns loop of photon emission data, the first time bin centered around the first sampling location (0 ps) would include 0 to 40 ps, the second time bin centered around the second sampling time (2.5 ps) would include 0 to 42.5 ps, the third time bin centered around the third sampling time (5 ps) would include 0 to 45 ps, etc.

Once the photon data in the channel is grouped in the time bins (operation 300), program code running on the workstation implementing the present invention aggregates the photons in each time bin (310). In one example, the aggregation is the sum of the photons in each bin. Therefore, if there are four photons in a time bin, then the time bin is associated with four photons.

The grouping and summation of photons in time bins compensates for the jitter introduced by the detector by capturing most or all of the photon emissions from a particular transistor in one time bin as opposed to being distributed across multiple discrete points.

FIG. 4B illustrates an example of the photon emission data associated with the histogram of FIG. 4A, after the photon emission data has been binned and summarized. Two features of the binning and summarization operations are illustrated in FIG. 4B. First, in the seventh bin 120, it can be seen (FIG. 4A) that the original data had two photons 122 at one sampling time and one photon 124 at a second sampling time. In FIG. 4B, it can be seen that in the seventh time bin 120, the three photons 126 are summed and centered in the time bin. Second, in the overlap 128 between the eleventh 130 and twelfth 132 time bin (FIG. 4A), it can be seen that the original data has one two-photon emission peak 134. In FIG. 4B, due to the location of the two photon emission peak 134 in the overlap region 128, it can be seen that this emission peak 136 in the eleventh time bin 130 is summed with a second one-photon emission peak and centered in the eleventh time bin. It can also be seen that this emission peak was centered in the twelfth time bin. After the grouping and summation, the processed photon data is in condition for further processing to determine the likelihood that the photons were emitted by a transistor.

Referring to now FIG. 3B, a flowchart is shown illustrating the operation involved in applying any one of various filters to the photon emission data to provide processed photon emission data accounting for the jitter in the detector. As with summarizing the photon emission data within discrete time bins, filtering the photon emission data is a means to account for the timing errors introduced by jitter. The filtering of the photon emission data comprises the convolution of the photon emission data with a specified function to obtain processed photon emission data (320). In one implementation of the present invention, the photon emission data is convolved with a triangle function with a full-width half maximum (FWHM) of 80 ps to provide processed photon emission data. In another implementation of the present invention, the photon emission data is convolved with a Gaussian function with a FWHM of 80 ps to provide processed photon emission data. Both filters perform low passband filtering to smooth the data. In a time region with transistor photon emissions spread within the TTS of the detector, the convolution will have the effect of averaging the emissions to raise them above the level of background emissions.

Referring to FIG. 3C, a flowchart is shown illustrating the operation involved in convolving the photon emission data with a normalized gate function (330), which provides processed photon emission data accounting for the jitter in the detector. In one example, the convolution of the photon emission data with a normalized gate function is configured to provide a summation of the photons in a time window of 80 ps centered around each sampling point, which provides results similar to the binning and summation method discussed with reference to FIG. 3A. The binning and summing operation aggregates the photons in a time bin, so four photons detected at four sampling points within the bin, may become a single four photon count emission peak at one sampling point at the center of the bin. The convolution of the processed photon emission data with a gate function, in contrast would provide four, four-photon peaks at each of the sampling points where the unprocessed one-photon emission peaks exist.

Event detection involves the determination of whether a photon or photons were emitted by a transistor. Referring again to FIG. 2, after application of any of the methods described with reference to FIGS. 3A–3C, the processed photon emission data is further processed to determine the likelihood that all or some of the photons within the group (e.g., the defined channel region) were emitted by a transistor. The determination of whether the photon emission data originated from a transistor involves a statistical analysis of the processed photon emission data that provides the likelihood or a probability that the photons were emitted from a transistor.

FIGS. 5A–5C each illustrate a method for determining the likelihood or probability that all or part of the photon emission data is from a transistor. FIG. 5A illustrates a method of defining an N-threshold level above which the photons in the channel are likely emitted from a transistor. FIGS. 5B and 5C each illustrate a method of obtaining a probability that the photons within the channel were emitted by a transistor. The methods in FIGS. 5A–5C, along with the methods described earlier, provide various ways to rapidly discriminate between transistor photon emissions and background photon emissions.

Referring now to FIG. 5A, a flowchart is shown illustrating the operations involved in obtaining a threshold level (N) above which photons are likely attributable to transistor emissions (referred to as "N-level thresholding"). In one example of the present invention, the threshold level (N) is defined as:

$$N = \text{Background Level} + n * \text{Noise},$$

where n is an adjustable integer.

To determine N, first, the background photon emission level (background level) is determined (500). The background level is the sum of the photons emitted from the detector and the photons arising from other background emission sources. The photons arising from other background sources tends to be very weak and in some instances it may be assumed that the background level is only attributable to the detector. If a fairly short acquisition time is implemented so that most of the photons detected are from background emissions, then the background level may be estimated as the mean or the median of the number of photons in each time bin for data processed in accordance with the binning and summing operations described with reference to FIG. 3A, or the number of photons at each sampling point for data processed through convolving the data as described with reference to FIGS. 3B or 3C.

After the background level is determined, the noise level in the background emission (noise) is determined (505). The noise can be evaluated by computing the standard deviation of the processed photon emission data. For the data processed in accordance with the method of FIG. 3A, the noise is the standard deviation in the number of photons in each time bin. For the data processed in accordance with the methods of FIG. 3B or FIG. 3C, the noise is the standard deviation in the number of photons at each sampling point.

An integer "n" may be applied to the noise to adjust the threshold level to provide a greater or lesser certainty that photons detected above the threshold level may be attributed to transistor emissions (510). After the n-value is set, the threshold level is determined (515). The threshold value (N) is a function of the background levels and the noise, and defines a value above which photons are likely attributable to transistor emissions. The noise involves the standard deviation of the background emission levels. Thus, if an n-value of three (3) is chosen, this would represent three times the standard deviation of the noise (three-sigma). For a threshold value of N, with a three-sigma standard deviation, the confidence is 99.9% that photons above the threshold N are attributable to transistor emissions.

Generally, when employing the method of FIG. 5A, if the variation in background photon emissions (or noise) is a small value, then the signals attributable to photon emissions will be quickly recognized in the processed photon emission data above the background emissions. In such a case, a smaller n-value may be used, which will reduce the threshold level. With a lower threshold level, it will take less time to acquire sufficient transistor photon emissions to exceed the threshold and have a high confidence level or likelihood that the photons were emitted by a transistor. On the other hand, if the variation in background emissions is high, then the signals attributable to photon emissions will not be recognized as quickly in the processed photon data above the background emissions. In such a case, a larger n-value might be used to obtain the same confidence that the photon emissions are attributable to a transistor. Thus, greater background emission noise can result in longer acquisition times to reach a high confidence level (e.g., 99.9%).

Referring now to FIG. 5B, a flowchart is shown illustrating the operations involved in determining a probability or likelihood that all or some photons in the processed photon data were emitted by a transistor. This probability determination involves Poisson statistics. For any set of processed photon emission data, it is possible to determine the mean background photon emissions for the processed photon data and compute the probability of having N photons from background emissions. If it is assumed that the distribution of background photon emissions follows Poisson statistics, then the probability of having N photons attributable to background emissions (of the detector TTS wide) is given by:

$$Pr(N_{Background}) = \frac{e^{-\mu} \cdot \mu^N}{N!}$$

$\mu$=mean of background emissions.
N=total number of detected photons.

To implement the above probability determination (PR ($N_{Background}$)), the total number of photons detected (N) while the IC was being tested is determined (520). In addition, the mean ($\mu$) or the median of the background photon emissions is determined (525). For the binned processed data, the mean or the median of the background photon emissions is the mean or median of the number of photons in each time bin. For the convolved processed data, the mean or the median is taken for the number of photons at each sampling point. With the total number of photons and the mean of the background photon emissions, the probability of having the mean number of photons in the time bin due to background emissions may be determined in accordance with the above equation for Pr($N_{Background}$) (530).

The probability of having N photons from transistor emissions (535) is given by:

$$N_{Transistor} = 1 - Pr(N_{Background})$$

Thus, for example, if there are four photons in a time bin and the probability of those photons being attributable to only background emissions is 20%, then the probability of those photons being attributable all or in part to transistor emissions is 80%.

Once the probability is determined, the probability of the photons having been emitted from a transistor may be displayed (540). The probability may be displayed collectively for the photons aggregated in a time bin, or may be displayed individually for the photon processed in accordance with the methods of FIG. 3B or FIG. 3C. Generally, a higher probability that the photons were emitted by a transistor translates into a higher confidence that the photon emissions are attributable to a transistor and not background emission.

In addition, a cutoff may be applied to the probability to only display photons that meet or exceed the cutoff (545). Generally, the cutoff is defined such that the probability of having photons below the cutoff level that are due to background emissions is so low that it is likely that some or all of the photons are attributable to transistor emissions. The cutoff level is adjustable, in one example a photon emission is considered likely if:

$$Pr(N_{Background}) < 0.1\%, \text{ or } Pr(N_{Transistor}) = 99.9\%$$

Thus, the cutoff is set at 99.9%, so only photons with a 99.9% probability of having been emitted by a transistor are kept and displayed either in a photon index or histogram, or both. For example, if there are eight photons in the time bin and the probability of those photons being attributable to only background emissions is less than 0.1%, then the binned photon value will exceed the cutoff and be displayed.

Referring now to FIG. 5C, a third method for determining the probability or likelihood that photons were emitted by a transistor is illustrated. For event detection as opposed to conventional precise timing detection, it is often adequate to identify that an event has occurred with some probability. In one implementation of the present invention as discussed above, the photon emission data may be processed with the bin width defined as the jitter or the TTS, $\Delta t_{TTS}$, of the detector. With a bin width equal to the jitter width, the average number of background emissions per bin is equal to:

$$\Delta N_{dk} = \frac{R_{dk} \cdot T_{acq}}{T_{loop} / \Delta t_{TTS}}$$

$T_{acq}$=acquisition time
$T_{loop}$=loop length
$\Delta t_{TTS}$=TTS of detector (120 ps for the Mepsicron II)

$\Delta t_{res}$=time resolution of the measurement
$S_{ph}$=detected signal photons/switch/um (depends on device technology)
$w_{gate}$=gate width (total gate width if device has multiple stripes)
$R_{dk}$=dark counts/s (in the signal channel) ("dark count" refers to photons emitted by the detector)
SNR=signal-to-noise ratio $$T_{acq} = T_{loop} \cdot \left(\frac{\Delta t_{TTS}}{\Delta t_{res}}\right)^2 \cdot \frac{w_{gate}S_{ph} + \Delta t_{TTS}R_{dk}}{(w_{gate}S_{ph})^2}$$

To determine $\Delta N_{dk}$, the background photon emission rate, $N_{dk}$ (operation 550), the photon acquisition time, $T_{acq}$ (operation 555), the loop time, $T_{loop}$ (operation 560), and the jitter of the detector, $\Delta t_{TTS}$ (operation 565) are each obtained. With these values, the system can determine the average background photon emission for the processed photon data (570).

The background photon emissions are randomly spaced and follow Poissonian statistics. The probability of finding N photons in a bin (575) is thus equal to:

$$P_{\Delta N_{dk}}(N) = \frac{e^{-\Delta N_{dk}} \Delta N_{dk}^N}{N!}$$

If a threshold is set at N photons, then the probability of finding N or more photons per bin is:

$$P^{geq}_{\Delta N_{dk}}(N) = \sum_{x=0}^{N} P_{\Delta N_{dk}}(x) = \sum_{x=N}^{\infty} \frac{e^{-\Delta N_{dk}} \Delta N_{dk}^x}{x!}$$

The average number of bins with more than N photons (580) is then equal to:

$$n(N) = \frac{T_{loop}}{\Delta t_{TTS}} P^{geq}_{\Delta N_{dk}}(N) = \frac{T_{loop}}{\Delta t_{TTS}} \sum_{x=N}^{\infty} \frac{e^{-\Delta N_{dk}} \Delta N_{dk}^x}{x!}$$

In order for the bin with N photons to be caused by signal photons, the likelihood that the N photons are result of background emissions should be set to a small value. In one implementation, n(N)<<1. n(N) is the probability that the bin with N photons are attributable to background emissions, so 1−n(N) is the probability that the N photon bin is attributable to transistor emissions.

FIG. 6 is a graph illustrating 1−n(N) as a function of the background emission rate of the detector. The graph in FIG. 6 shows that as the background emission rate increases, more photon emissions must be collected to achieve a given likelihood that the photons were emitted by a transistor.

FIG. 7A is a histogram of a full-sampling of data taken at a sampling rate of 2.5 ps for a 0.18 um CMOS inverter chain, running a test sequence at 100 Mhz. The y-axis is photon detections, and the x-axis is time in nanoseconds (ns). The sequence runs for 100 ns ($1 \times 10^{-7}$ second) before repeating in a loop. The x-axis is thus 100 ns. With a frequency of 100 MHz, the clock cycle is 10 ns ($0.1 \times 10^{-7}$ second). Thus, a switching event can be expected every 10 ns. The sampling rate is 2.5 ps; thus, there are $0.1 \times 10^{-7}$ (clock cycle)/$2.5 \times 10^{-12}$(sampling rate)=40,000 sampling points between each cycle. The 80,000 photons collected for the full-sample data were obtained in 2 minutes 45 seconds.

FIG. 7B illustrates a histogram of the full-sample data illustrated in FIG. 7A after the binning and summing operations of FIG. 3A are performed. The data was processed with each time bin being 80 ps wide and having a 10 ps overlap with the adjacent time bin. Referring to FIG. 7A having the full sample data shows an emission peak at 20 ns (two photons), 40 ns (three photons), 50 ns (two photons), 70 ns (two photons), 80 ns (three photons), and 90 ns (two photons). Emission peaks, however, are not shown at 0 ns, 10 ns, 30 ns, and 60 ns. In comparison to the full-sample data of FIG. 7A, the binned and summed data shown in FIG. 7B illustrates more pronounced emission peaks at each of the cycle points (i.e., 10 ns, 20 ns, etc.). A properly functioning switching transistor emits photons at the cycle points. For example, at the 10 ns time point, no emission peak is shown in the full-sample data whereas an emission peak of six photons is shown in the binned and summed data. In another example, at the 70 ns time point of the full-sample data, a two photon emission peak is shown, whereas a ten photon emission peak is shown at the 70 ns time period in FIG. 7B.

The emergence of the emission peaks in the binned and summed data of FIG. 7B is a result of the high concentration of photons around the time period when a transistor switches. For example, due to jitter, around or at the 10 ns time period, there is likely to be several emissions very closely spaced but not exactly at the same sampling point. When these points are summed in a bin around the 10 ns period, the photon emission peak emerges as shown in the histogram for the binned and summed data. The photon emission peak includes six photons, thus there were six photons closely spaced together in the 80 ps time bin centered at the 10 ns sampling point.

FIG. 7C illustrates a histogram for the full-sample emission data convolved with a normalized gate function. The results of the convolution with the normalized gate function are similar to the results for the binned and summed data. Notably, the emission peaks for both the binned and summed data and the combined data are more pronounced than the full-sample data. Stronger emission peaks than even the summed and binned data, however, can be seen at the 0 ns (ten photons), 20 ns (seven photons), 40 ns (thirteen photons), 50 ns (fourteen photons), 60 ns (ten photons), 70 ns (fifteen photons), 80 ns (fourteen photons), and 90 ns (nine photons) sampling points. From FIGS. 7B and 7C it can be seen that the binning and summing operations and the convolution with a normalized gate function provide a stronger indication of transistor emissions than does the full-sample data shown in FIG. 7A. Thus, both the binning and summing operation or the convolution with a normalized gate function to obtain processed photon data might be used alone for event detection, in accordance with the present invention. Both of these methods, however, may lead to the detection of false events unless a sufficient number of photons are collected or a cutoff level is appropriately determined. For example, in FIG. 7B, there is a peak between the 10 ns sampling point and the 20 ns sampling point and between the 20 ns sampling point and 30 ns sampling point. If a cutoff level of one photon were used, then these two events may be falsely detected as transistor emissions. In FIG. 7C, a false event between the 10 ns and 20 ns sampling point and the 20 ns and 30 ns sampling point can also be seen if a cutoff of one photon were used.

FIG. 7D illustrates a histogram of the full-sample data of FIG. 7A processed using the N-level thresholding method described with reference to FIG. 5A. In this histogram, peaks at each of the 10 ns cycle points are clearly shown. An N-threshold level is illustrated as the dashed line near the bottom of the histogram. The N-threshold level was determined with an n-value of six thus providing a 99.999% probability or confidence level that photons above the dashed line are attributable to transistor emissions. FIG. 7E is a histogram illustrating the full-sample data processed using probability level thresholding. In this example, a photon threshold level of three was set above which any peak emerging could be attributable to transistor emissions with a 99.999% probability. Thus, for any emission peak rising above the N-threshold level or the probability level there is a 99.999% likelihood that these peaks are due to transistor emissions. As there are no peaks rising above the threshold that are not at the 10 ns time cycles, it can be seen that no background emissions were falsely detected as transistor emissions. Thus, N-level thresholding and probability thresholding (FIGS. 7D and 7E) in conjunction with processing the photon emission data provides a more accurate indication of transistor emissions in a shorter time period than the processed photon data alone (FIGS. 7B, 7C).

The various embodiments of the present invention discussed above with regard to FIGS. 1–7E, in some instances, involve the processing of a discrete set or group of the photon emission data to identify a transistor or transistors and to extract timing information. The following embodiments of the present invention discussed with reference to FIGS. 8–16, in some instances, involve the processing of the entire set of photon emission data to identify a transistor or transistors and to extract timing information. It will be recognized that some aspects, operations, and features may be useful in various combinations of the embodiments.

The embodiments of the present invention discussed hereafter involve discriminating between photon emitted by transistors and photons emitted by other background sources by processing of the photon emission data to correlate photons spatially and temporally. The correlation may provide for rapid identification of photons emitted from switching transistors and for rapid extraction of accurate timing information for the switching transistors. The correlation may also provide for auto channeling of transistors in the photon image data. The correlation may be applied to photon emission data from a single switching transistor or for photon emission data from numerous switching transistors.

As discussed above, a conventional probe system requires the user to manually identify the photon emission data in the field of view for which to obtain timing information. This is performed by using GUI of the workstation to define a channel around the photons to analyze. Besides having to manually identify the photons to analyze, such conventional systems oftentimes require a substantial amount of time to obtain sufficient photon emission data so that the photons emitted from transistors are identifiable over the background emissions and so that useful timing information may be extracted. Implementations of the present invention rapidly and automatically identify transistors in the field of view, and rapidly extract transistor photon emission data from the identified transistor useful in timing analysis.

FIG. 8 is a flowchart illustrating the overall operations involved in rapidly and automatically discriminating between photons emitted from transistors and photons emitted from other background sources, and extracting useful timing information for the transistor or transistors associated with the photons emitted from transmissions. First, the IC imaging station 102 obtains photon emissions from an operating IC and the acquisition electronics 106 records the photon emission data in a database or other memory structure (800). Each recorded photon emission includes, in one example, both a spatial (x, y) and temporal (t) component.

In other implementations of the present invention, photon emission data obtained with a superconducting single photon detector may be analyzed. Such a detector is described in copending and commonly owned application Ser. No. 09/628,116 filed on Jul. 28, 2000, titled "Superconducting single photon detector," which is hereby incorporated by reference as though fully set forth herein. In some instances, data collected with a single photon detector will only have a time component. These detectors have very little background emissions; thus, they are able to rapidly extract precise photon emission timing information. The single photon detector may be arranged to obtain photon emission data at the same time as the detector of the probe system 100. Embodiments conforming to the present invention may be used to correlate data from the single photon detector with photon emission data from the detector of the probe system 100.

After photon emissions are obtained for the IC under test, each transistor in the field of view is identified (810). The transistors are identified by correlating the photons recorded in the field of view with other photons in the field of view. The correlation may use only the spatial characteristics of the photons, only the temporal characteristics of the photons, or both. Probe systems detect both random background photon emissions and photon emissions from switching transistors. Implementations of the present invention automatically discriminate between background emissions and transistor emissions to identify transistors in the field of view. Generally, photon emissions that are closely correlated in space may be associated with a transistor rather than background. Moreover, photon emissions that are closely correlated in time may also be associated with a transistor rather background. Aspects of the present invention utilize the correlation of photons in space, in time, or both in space and time, to identify photons that are likely emitted from a transistor rather than background sources, and thereby identify transistors in the field of view.

The correlated photons may then be used to generate accurate timing histograms for the detected transistors (820). The correlation of the photon data tends to provide dense clusters of photons at the commutation points of the transistor. By comparing the timing intervals between the clusters, the switching time of the transistors may be identified.

FIG. 9 is a flowchart illustrating the operations involved in a method for correlating photons and automatically identifying transistors from the correlated photon data in accordance with one embodiment of the invention. In one implementation of the invention, each photon is analyzed to determine if it correlates with other recorded photons either spatially, temporally, or both. The number of spatially and/or temporally correlated photons is used to generate a weighting that is applied to the selected photon.

As with other methods discussed herein, the system obtains photon emission data for an IC within the field of view of the detector. To obtain photon emission data from the IC that may be used to diagnose faults in the IC, a test sequence that causes the transistors to switch states is run on the IC at a known frequency. As discussed above, switching states may cause CMOS transistors to emit a photon. The probability of a transistor emitting a photon during a single switching event, however, is extremely small. In some instances, the probability of detecting a near infrared photon for each switching event ranges between $10^{-7}$ to $10^{-11}$ photons per switching event per $\mu$m of gate width. Thus, the test sequence may be repeated in a loop so that some photon emissions from each of the transistors in the field of view will likely be detected.

While the test sequence is being run, the probe system records the spatial and temporal characteristic of each detected photon. In one specific implementation, each recorded photon emission includes an associated x-component, y-component, and time component. The field of view for the Schlumberger IDS PICA probe system includes an x-region or horizontal region that is 4096 pixels wide and a y-region or vertical region that is 4096 pixels high. The x-component of the recorded photon emission data corresponds with the position or pixel location along the x-axis where the photon is detected. The y-component of the recorded photon emission data corresponds with the position or pixel location along the y-axis where the photon is detected. The time component of the recorded photon emission data corresponds with the time during a particular loop when the photon is emitted or recorded.

After the test sequence is complete, each of the recorded photons are correlated with other recorded photons. The operations illustrated in FIG. 9, relate to correlating one photon with the other recorded photons. The operations may be repeated as many times as necessary to process all of the recorded photons in the collected photon emission data. In other implementations, it is possible to identify a subset of all of the recorded photons, and only correlate those photons with other photon in the same subset. Such a subset may also be identified as a spatial subset, a temporal subset, or both. Depending on the configuration of the system, operations may be performed while the test sequence is running on the IC, immediately after the test sequence is complete, or at any time after the test sequence is run and the photon emission data has been recorded.

Referring again to FIG. 9, first, the system or the user selects one particular photon to analyze (900). Typically, the system runs the correlation on all photons in the photon emission data. Next, the system analyzes the selected photon to determine if any of the other photons in the field of view spatially correlate with the selected photon (910). In one implementation of the present invention, to spatially correlate the selected photon with other photons in the photon emission data, the system determines the number of photons within a set spatial area surrounding the selected photon.

FIG. 10A is a diagram illustrating one way that photons maybe spatially correlated. In this example, to determine if any photons spatially correlate with the selected photon 140, the system determines the number of photons in an area 20 pixels by 20 pixels centered on the selected photon. Thus, in this example, the three photons 142 in the area 10 pixels above and below the selected photon and 10 pixels to either side of the selected photon will be counted and considered to spatially correlate with the selected pixel. The two photons 144 outside this area will not correlate with the selected photon.

The spatial correlation area used to determine which photons are correlated with the selected photon may be adjusted according to the any number of factors. Generally, one objective is to define the spatial correlation area so that it likely encompasses photos emitted from the selected transistor, but does not likely encompass photos emitted from other nearby transistors. Any number of factors may effect the spatial location at which photons emitted from the selected photon are detected, such as, the size of the transistor, the size of the channel region in the transistor, the current flow through the channel region, the switching voltage of the transistor, the spatial separation of transistors in the IC, the noise in the system, or end the angle at which photons are emitted from the transistor.

In one implementation of the present invention, the number of photons located in the spatial correlation area is used to generate a weight for the selected photon. For each photon in the spatial correlation area, the selected photon is associated with one weight point. Thus, with four total photons in the spatial correlation area, the spatial weight for the selected photon is four. In this implementation, only the number of photons in the spatial correlation area is used to generate the weight. The temporal relationship with other photons is not used to determine the weight. Generally, background photons are detected in a spatially random pattern. Thus, the present inventors recognized that if there is a high concentration of photons in a particular spatial area, then those photons may be associated with transistor emission rather than background emissions.

In some instances, background photon emissions may nonetheless appear in spatial relation to each other or to transistor photon emissions and thus give the impression of transistor emissions. Accordingly, in another implementation of the present invention, the system further determines if any of the photons in the photon emission data temporally correlate with the selected photon (920). To temporally correlate photons, the system determines the number of photons in a set temporal area surrounding the selected photon. The temporal correlation area or range may be defined in any number of ways. For example, the temporal area may be set at 50 ps. In this example, any photon that is detected either 25 ps before or 25 ps after the selected photon, is correlated with the selected photon. In another example, the jitter of the detector may be used to define the temporal area in which to correlate photons. Thus, for example, if the jitter is 80 ps, then the temporal area by which to correlate photons is set at 80 ps.

FIG. 10B is a diagram illustrating one way that photons are temporally correlated. The diagram at FIG. 10B corresponds with the diagram at FIG. 10A. In this example, there are two additional photons 146 in the 50 ps range around the selected photon 140. There are two photons 148 outside the 50 ps range. Recall, in FIG. 10A it can be seen that there are three photons in the spatial range around the selected photon.

As with the spatial correlation, each photon that is temporally correlated with the selected photon is used to generate a temporal weight for the selected photon. Thus, if there are three total photons in the set temporal area, then the temporal weight for the selected photon is three. In one implementation of the present invention, only the number of photons in the temporal correlation area is used to generate the weight. The spatial relationship is not used.

After generation of the spatial and temporal weights, an overall weight may be assigned to the selected photon that is a function of the spatial and temporal weights (930). The weight, whether described with reference to operation 930 or operation 1120, provides an indication of the likelihood that the photon was emitted from a transistor. In one example, the overall weight is the sum of the spatial weight and the temporal weight. Thus, if the spatial weight is four (4) and the temporal weight is three (3), then the overall weight is seven (7). In the above described method of correlating photons as a function of the spatial and temporal characteristics, the spatial correlation and the temporal correlation are completed independently, and the overall weight is the summation of the two independent weight determinations.

In another implementation of the present invention, the overall weight may be assigned as the lesser or greater of the spatial and temporal weight. Thus, the overall weight would be three (3) or four (4), respectively. It is possible that some photons will be only correlated in space or in time, but not in both.

In an alternative implementation of the present invention, the correlation of the spatial and temporal characteristics of neighboring photons is performed so that photons must be within a certain spatial range and a certain temporal range. As with the method of FIG. 9, the correlation discriminates between photons emitted from transistors and background sources. FIG. 11 illustrates a flowchart of the operation involved in one method for performing temporal and spatial correlation of photons within photon emission data, in accordance with the present invention. First, a particular photon from all of the photons within the photon emission data is selected for spatial and temporal correlation (1100). As will be recognized, the operations involved in correlating a photon with other photons may be repeated until all of the photons in the photon emission data are processed.

The selected photon is then compared to other photons within the photon emission data to determine how many photons are within a set distance and time (1110). The size of the correlation distance and time may be set to any number of different ranges. In one example, the distance or spatial correlation may be set at 20 pixels and the temporal correlation set at 80 ps. It is also possible to define the correlation region around the selected photon in many different ways. For example, FIG. 12A illustrates spatial correlation and temporal correlation centered around the selected photon 150. The spatial correlation defines a 20 pixel (x-component) by 20 pixel (y-component) square centered on the selected photon. Thus, any photons within 10 pixels above, below, or to either side of the selected pixel will be considered spatial correlated. The temporal correlation is defined as a range of time between 40 ps before the detection of the selected photon and 40 ps after the detection of the selected photon. Thus, the spatial and temporal range define a cube centered on the selected photon.

Alternatively, as shown in FIG. 12B, the spatial correlation may define a 20 pixel by 20 pixel square, with the selected pixel in the upper left corner of the square. Thus, any photons 20 pixels to the right and 20 pixels below the selected photon will be considered spatially correlated. Likewise, the temporal correlation may define a 80 ps range only ahead of the time at which the selected photon was detected. Thus, the spatial and temporal range define a cube within the selected photon in a corner. Alternatively, the correlation might be arranged in other ways, such as detecting photons up and to the left of selected photon and only behind the selected photon (not shown).

Only the photons within both the spatial and temporal ranges of the selected photon are used to weight the selected photon (1120). Thus, for example, referring to FIG. 12A, there are three photons 152 that are within the cube defined by the x, y, and t axes (i.e., the spatial and temporal range). There is a fourth photon 154 that is within the spatial range, but is not within the temporal range. There are two photons (154, 186) completely outside the cube. Thus, the weight for the selected photon is three. Referring to FIG. 12B, there are two photons 158 within the cube defined by the x, y, and t axes. There is a third photon 160 that is within the temporal range, but is not within the spatial range. There are two photons 162 that are not within the spatial or temporal correlation area. Thus, the weight for the selected photon 180 is two.

Referring again to FIGS. 9 and 11, after each of the photons in the field of view are analyzed to determine if they correlate with other photons in the field of view spatially, temporally, or both, and an appropriate weight is assigned to the photons, the transistors in the field of view may be identified (operations 940 and 1130, respectively). The assigned weight generally provides an indication of the probability that the photon was emitted by a transistor. Thus, the weight may be used to discriminate between photons emitted by a transistor and background photons. In addition, a threshold or cutoff valve may be applied to only display photons with a certain weight.

In one implementation, all of the photons from the photon emission data are displayed in colors according to weight. A color may be assigned to each weight, or colors may be assigned to various ranges of weight. In a simple example, all photons with a weight of four will be red and all photons with a weight of only one will be white. The red photons will likely be from a transistor and will stand out from the white photons. The contrast between the colors will provide the user with an indication of where the functioning switching transistors in the photon emission data are located. Besides displaying the photons accorded to weight, the weighted photon emission data may be processed in other ways.

FIG. 13 is a flowchart illustrating one example of the operations for establishing and applying a threshold to a set of photon emission data to further identify transistors. Generally, photons with a weight, either spatial, temporal, or some combination of spatial and temporal, meeting or exceeding a threshold value are associated with a transistor, and all photons having a weight less than the threshold value are associated with background noise. The threshold value may be based on anecdotal information, statistical analysis of the photon emission characteristics of the transistors being analyzed, and by other means. Referring to FIG. 13, in one example, the system determines the highest weight for any of the photons in the field of view (1300). The threshold is set as a percentage of the highest weight (1310). For example, the threshold value may be set at 20% of the highest weight value. Thus, if the highest weight for any photon in the field of view is 15, then the threshold value is set at three.

After the threshold value is determined and applied against the photons, the system associates each photon having a weight of equal to or greater than the threshold value with a transistor (1320). Thus, in the above example, each photon having a weight of three or more is associated with a transistor. To illustrate transistors in the field of view, all photons associated with a transistor may be displayed in the spatial location, i.e., at the same x and y pixel location, that they were detected, and each photon having a weight of two or less is not displayed. Alternatively, event photons may be displayed with one color, and background photons displayed with a second color. In a histogram, only photons exceeding the threshold are displayed.

Correlated photon data, provided in accordance with the present invention, may also provide very accurate timing information for the transistors associated with the photon emission data. Moreover, such accurate timing data may be provided in a period of time considerably less than the same accuracy of timing data that is provided from conventional probe systems.

FIG. 14A is an illustration of photon emission data provided by a conventional probe system. The photon emission data is for one commutation point of a switching transistor. Due to the jitter of the detector, photon emissions 164 are detected in a range of the jitter around the commutation point 166. To extract timing information from the histogram, a centroid 168 is determined for all of the photon emissions within the range of the jitter for the detector. To obtain enough photon emissions to obtain an accurate centroid the system must be run long enough in order to detect numerous photon transistor emissions.

In comparison, FIG. 14B illustrates a histogram for correlated photon emission data. Due to the weighting of photon emissions in both space and time, a well defined photon emission peak 170 emerges with very few photon detections. In this example, three photons 172 are correlated in both space and time at the commutation point for the transistor. Because the three photons are correlated in both space and time, each will receive a weight of three. Without correlation in both space and time, each would have a value of only one and thus would not arise above the background photon emission level. Being weighted, however, each value is three times the background emission level. As with the raw histogram data, the centroid of the three weighted photon emissions may be determined. This centroid may be compared with the centroid of other emission peaks to extract the precise timing information for the transistor associated with the histogram. In this example, only three photon emissions for the transistor are required in order to extract precise timing information. In the example illustrated in FIG. 14A, fifty-one photon emissions are detected before accurate timing information can be extracted. Depending on many factors, the number of photon emissions required for conventional systems to extract timing information may vary. Nonetheless, the number of photon emissions tends to be dramatically more than is required with the correlation methods described herein.

The present invention also involves a method for automatically channeling photon emission data. Auto channeling analyzes the correlated photon emission data to identify spatially and temporally related clusters of photons. If the cluster of photons is large enough and closely related in space and time, then the photons are considered to have been emitted from a transistor. On the photon emission image, a rectangle is drawn around the cluster of photon emissions. In conventional probe systems, a user manipulating a GUI may define a rectangle, i.e., channel, around a suspected group of photons that were emitted from a transistor. Before such a group of photons may be recognized, a tremendous number of photons have to be collected in order for a large enough concentration of photons to emerge from the background emissions. Using the correlation methods described herein, photons closely correlated in space and time have much higher weights than photons that are not correlated in space and time. As discussed above, photons exceeding a certain weight are considered to have been emitted by a transistor. Auto channeling sorts through all of the photon emission data to identify clusters of highly weighted photons. These clusters of high weight photons are considered to have been emitted from a transistor.

FIG. 15 is a flowchart illustrating the operations involved in auto channeling, in accordance with one embodiment of the present invention. Generally, auto channeling involves a structured search of the photon emission data along the x, y, and t axes to identify clusters of high weight photons. In one implementation, the search begins at t=0, x=0, and y=0 (1600). FIG. 16 is a diagram illustrating a search of the photon emission data to identify clusters of photons having a weight exceeding the threshold value above which photon emissions are attributable to transistor emissions.

The search begins by incrementing x until a photon with a weight exceeding the threshold value is detected (1605). Generally, the x-value is incremented until it reaches 4095 which is the field of view pixel size (1610). At x=4096, x is set to 0 and y is incremented (1615). The search precedes in a serpentine manner until a y-value of 4096 is reached (1620). When y=4096, the time value is incremented by the jitter or other time increment (1625). If the jitter is 80 ps then the time value is incremented by 80 ps. After the time is incremented, x and y are reset to 0 and the search continues with incrementing x-values and incrementing y-values until the entire correlated photon emission data set is autochanneled (1630).

During the search, when a weight value equal to the threshold is detected (1635), a cube around the photon is defined (1640). The cube includes a spatial range (x-range, y-range) and a temporal range. In one example, the x-range and y-range are each 20 pixels and the time range is 80 ps. The first corner of the cube is defined as $x_{photon-10\ pixels}$, $y_{photon-40\ pixels}$, $t_{photon-40\ ps}$. Thus, the photon occupies the center of the cube and the x, y and t axes extend in all direction from the photon.

Once the cube is defined, all photons within the cube meeting or exceeding the threshold value are identified (1645). After all the photons are identified, then the number of photons identified is compared with a second threshold value (1600). If the number of identified photons exceeds the threshold value, then this cluster of photons is considered to be a transistor. To automatically display a channel around the cluster of photons in the cube, a rectangle is drawn around the x-range and y-range of photons that were identified (1655).

As discussed above, photons meeting or exceeding the weight value are considered to have likely been emitted from a transistor. A photon of such weight by itself, or in the presence of a very few other photons with such weight, may or may not have been emitted from a transistor as these photons may be attributable to background emissions.

In addition to automatically identifying transistors from photon emission data, spatially and temporally correlated photon emission data may also be used to extract accurate timing data for each of the identified transistors in much less time than is typical for conventional probe systems. Photons emitted from a transistor tend to be clustered in both space and time. Thus, in most situations, transistor photon emissions from the same transistor will have the same or nearly the same weight after the spatial and temporal correlation methodologies discussed above are applied.

While various embodiments of the invention have been particularly shown and described, it will be understood by those skilled in the art that various other changes in the form and details may be made without departing from the spirit and scope of the invention, which is defined by the following claims.

We claim:

1. A method for analyzing photon emission data to discriminate between photons emitted from a transistor and noise, the photon emission data comprising a first photon emission and at least one second photon emission, each photon emission comprising characteristics including a spatial component corresponding with the space where each photon was detected and a temporal component corresponding with the time when each photon was detected, the method comprising:

receiving the first photon emission and the at least one second photon emission; and determining whether at least one characteristic of the first photon emission correlates with at least one characteristic of the second photo emission;

wherein the first photon emission and the second photon emission are attributed to a transistor rather than noise when at least one characteristic of the first photon emission correlates with at least one characteristic of the second photon emission.

2. The method of claim 1 further comprising the operation of assigning a weight the first photon emission as a function of the operation of determining.

3. The method of claim 2 wherein the operation of determining comprises comparing the spatial component of the first photon emission with the spatial component of the at least one second photon emission.

4. The method of claim 3 wherein the spatial component of the first photon emission comprises a first x-value and a first y-value, and wherein the spatial component of the at least one second photon emission comprises at least one second x-value and at least one second y-value.

5. The method of claim 3 wherein the operation of comparing further comprises determining if the first x-value is within a x-range of the at least one second x-value.

6. The method of claim 5 wherein the operation of comparing further comprises determining if the first y-value is within a y-range of the at least one second y-value.

7. The method of claim 6 wherein the operation of assigning a weight to the first photon emission comprises assigning one weight value for each of the at least one second photon emissions having the at least one second x-value within the x-range and the at least one second y-value within the y-range.

8. The method of claim 3 further comprising:
comparing the temporal component of the first photon emission with the temporal component of the at least one second photon emission.

9. The method of claim 8 wherein the temporal component of the first photon emission comprises a first time value, and where the temporal component of the at least one second photon emission comprises at least one second time value.

10. The method of claim 9 wherein the operation of comparing further comprises determining if the first time value is within a time range of the at least one second time value.

11. The method of claim 10 wherein the operation of assigning a weight to the first photon emission comprises assigning one weight value for each of the at least one second time value within the time range.

12. The method of claim 10 wherein the operation of assigning a weight to the first photon emission comprises assigning one weight value for each of the at least one second photon emissions having the at least one second x-value within the x-range, the at least one second y-value within the y-range, and the at least one second time value within the time range.

13. The method of claim 3 wherein the spatial component of the first photon emission is the same as the spatial component of the at least one second photon emission.

14. The method of claim 1 wherein the operation of determining the first photon emission with the at least one second photon emission further comprises:
processing the first photon emission and the at least one second photon emission to provide at least one temporal subgroup of photons having similar temporal characteristics; and
determining a likelihood that photons within the temporal subgroup were emitted by a transistor.

15. The method of claim 14 wherein the operation of processing further comprises defining a plurality of time bins, each time bin defining a temporal range.

16. The method of claim 15 further comprising aggregating all photons within the temporal range.

17. The method of claim 16 wherein the first photon emission and the at least one second photon emission are collected from a transistor using a detector having a transit time spread, and further comprising setting the temporal range as the transit time spread.

18. The method of claim 14 wherein the operation of processing further comprises, for each photon within the temporal group, summing the number of photons within a set temporal range.

19. The method of claim 18 further comprising setting the temporal range as a transit time spread of a detector configured to detect the first photon emission and the at least one second photon emission.

20. The method of claim 1 further comprising
comparing the temporal component of the first photon emission with the temporal component of the at least one second photon emission.

21. The method of claim 20 wherein the temporal component of the first photon emission comprises a first time value, and where the temporal component of the at least one second photon emission comprises at least one second time value.

22. The method of claim 21 wherein the operation of comparing further comprises determining if the first time value is within a time range of the at least one second time value.

23. The method of claim 22 further comprising the operation of assigning a weight to the first photon emission as a function of the operation of correlating and wherein the operation of assigning a weight to the first photon emission comprises assigning one weight value for each of the at least one second time value within the time range.

* * * * *